United States Patent
Charoenratpratoom et al.

(10) Patent No.: US 12,230,615 B2
(45) Date of Patent: Feb. 18, 2025

(54) SEMICONDUCTOR PACKAGES WITH VERTICAL PASSIVE COMPONENTS

(71) Applicant: UTAC Headquarters Pte. Ltd., Singapore (SG)

(72) Inventors: Jiraphat Charoenratpratoom, Bangkok (TH); Phongsak Sawasdee, Bangkok (TH); Wannasat Panphrom, Bangkok (TH)

(73) Assignee: UTAC Headquarters Pte. Ltd., Singapore (SG)

( * ) Notice: Subject to any disclaimer, the term of this patent is extended or adjusted under 35 U.S.C. 154(b) by 655 days.

(21) Appl. No.: 17/558,592

(22) Filed: Dec. 22, 2021

(65) Prior Publication Data
US 2022/0208746 A1    Jun. 30, 2022

Related U.S. Application Data

(60) Provisional application No. 63/131,806, filed on Dec. 30, 2020.

(51) Int. Cl.
*H01L 25/16* (2023.01)
*H01L 23/00* (2006.01)
(Continued)

(52) U.S. Cl.
CPC ........ *H01L 25/16* (2013.01); *H01L 23/49524* (2013.01); *H01L 24/40* (2013.01); *H01L 23/3121* (2013.01); *H01L 23/49513* (2013.01); *H01L 24/32* (2013.01); *H01L 24/41* (2013.01); *H01L 24/48* (2013.01);
(Continued)

(58) Field of Classification Search
CPC ... H01L 25/16; H01L 23/49524; H01L 24/40; H01L 23/3121; H01L 23/49513; H01L 24/32; H01L 24/41; H01L 24/48; H01L 2224/32245; H01L 2224/40145; H01L 2224/40177; H01L 2224/40195; H01L 2224/4118; H01L 2224/48177; H01L 23/3107; H01L 23/552; H01L 24/73; H01L 24/92; H01L 25/03; H01L 25/074; H01L 2224/29101; H01L 2224/29298; H01L 2224/48091; H01L 2224/73221; H01L 2224/73271; H01L 2224/83801; H01L 2224/84801; H01L 2224/84815; H01L 2224/40245; H01L 2224/48247; H01L 2224/48471; H01L 2224/73265; H01L 2224/83815; H01L 2224/8384; H01L 2224/92247; H01L 2924/00014; H01L 2924/181; H01L 2924/19105; H01L 23/36; H01L 23/49575; H01L 23/49589; H01L 23/49562
See application file for complete search history.

(56) References Cited

U.S. PATENT DOCUMENTS

2017/0271266 A1* 9/2017 Kim ............... H01L 23/5384

* cited by examiner

*Primary Examiner* — Robert G Bachner
(74) *Attorney, Agent, or Firm* — HORIZON IP PTE LTD.

(57) ABSTRACT

An embodiment related to a package is disclosed. The package includes a component mounted to a die attach region on a package substrate. A passive component with first and second passive component terminals is vertically attached to the package substrate. An encapsulant is disposed over the package substrate to encapsulate the package. In one embodiment, an external component is stacked above the encapsulant and is electrically coupled to the encapsulated package.

20 Claims, 23 Drawing Sheets

(51) Int. Cl.
 *H01L 23/31* (2006.01)
 *H01L 23/495* (2006.01)
(52) U.S. Cl.
 CPC ............... *H01L 2224/32245* (2013.01); *H01L 2224/40145* (2013.01); *H01L 2224/40177* (2013.01); *H01L 2224/40195* (2013.01); *H01L 2224/4118* (2013.01); *H01L 2224/48177* (2013.01)

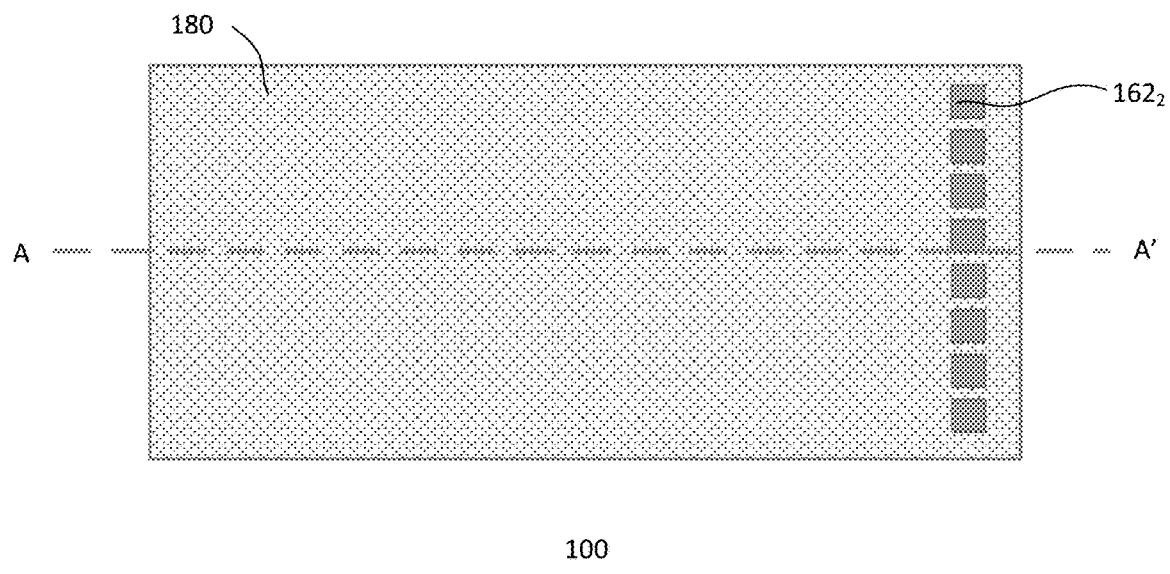
Fig. 1a$_i$
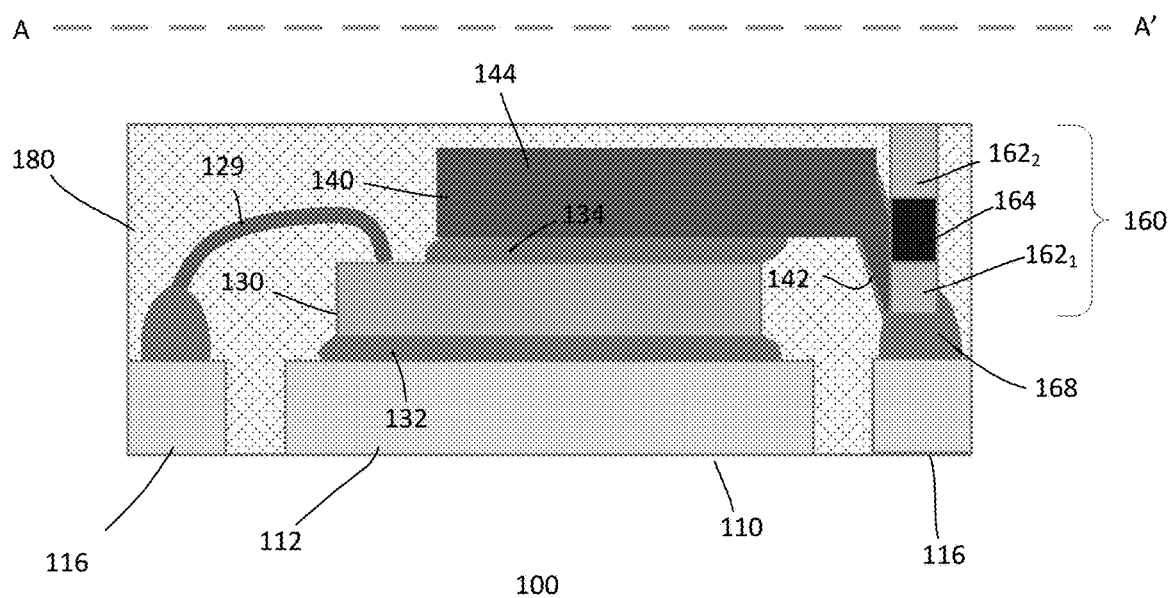
Fig. 1a$_{ii}$

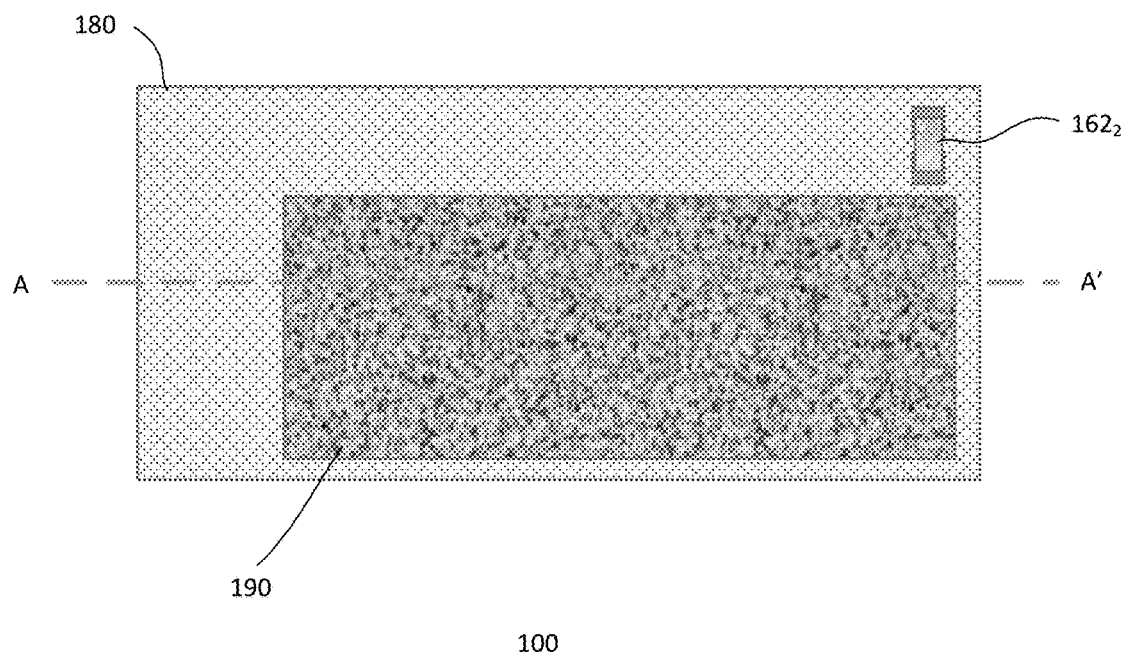
Fig. 1b$_i$
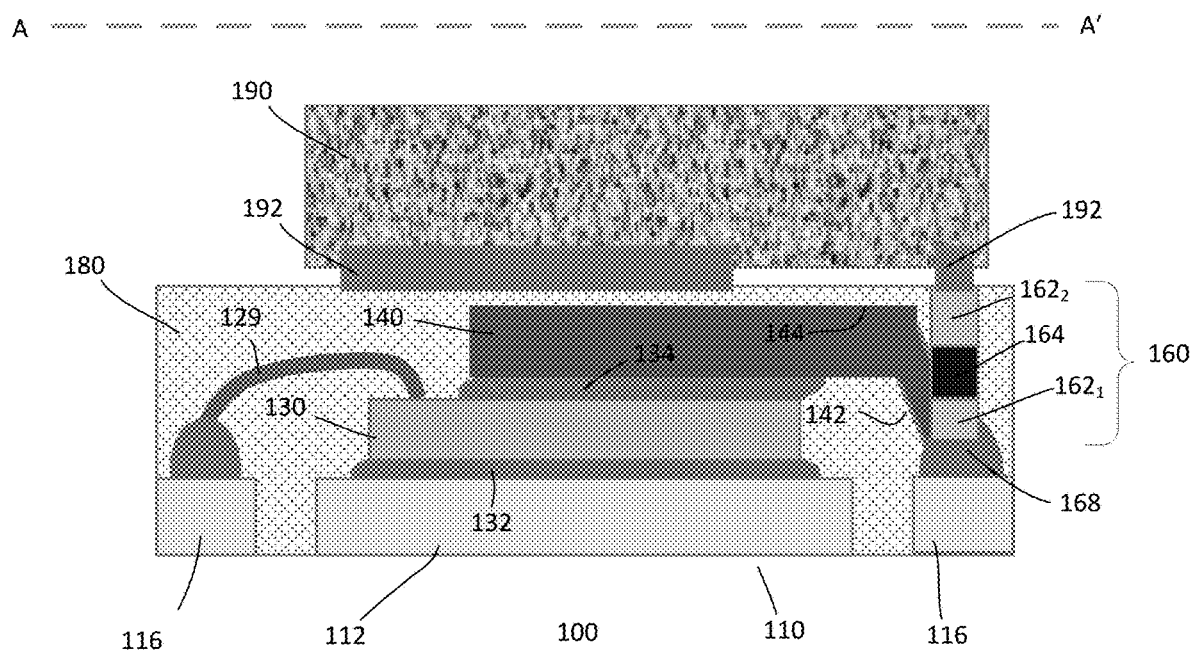
Fig. 1b$_{ii}$

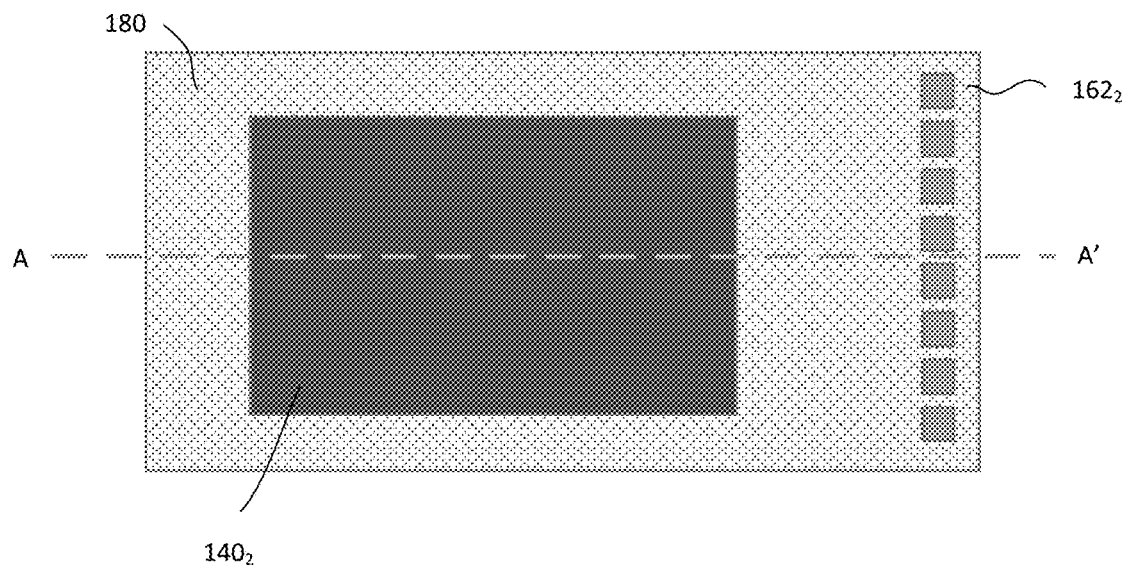
Fig. 2a$_i$
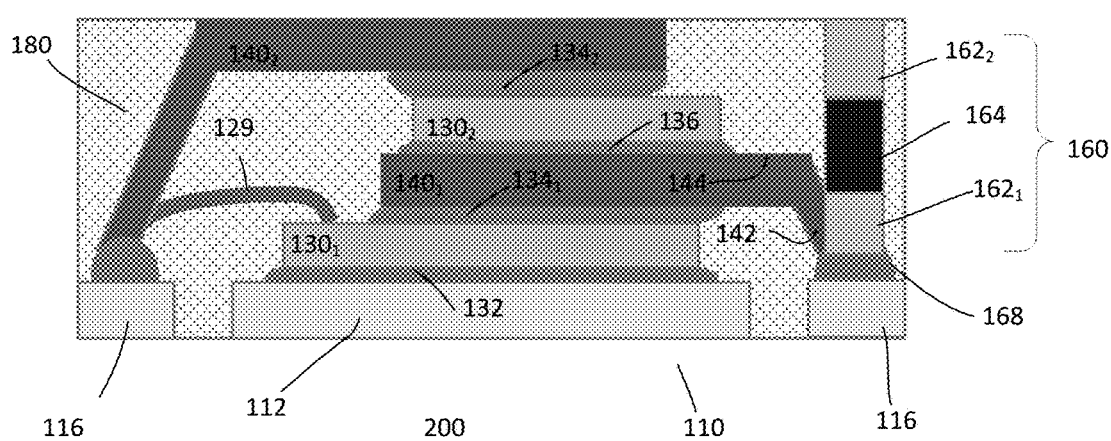
Fig. 2a$_{ii}$

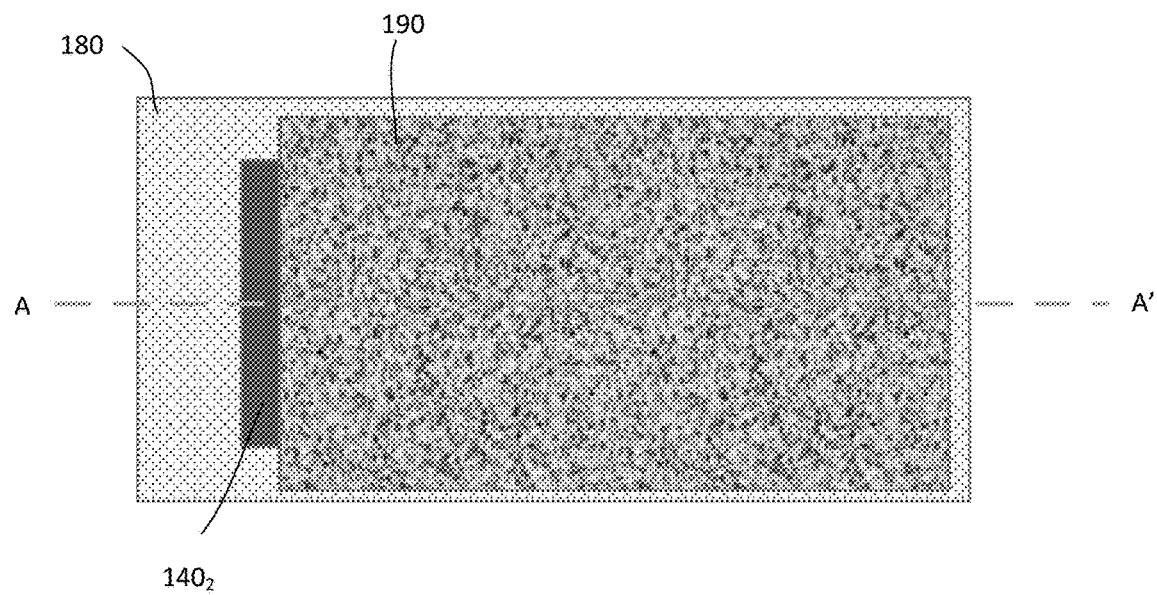
Fig. 2b$_i$
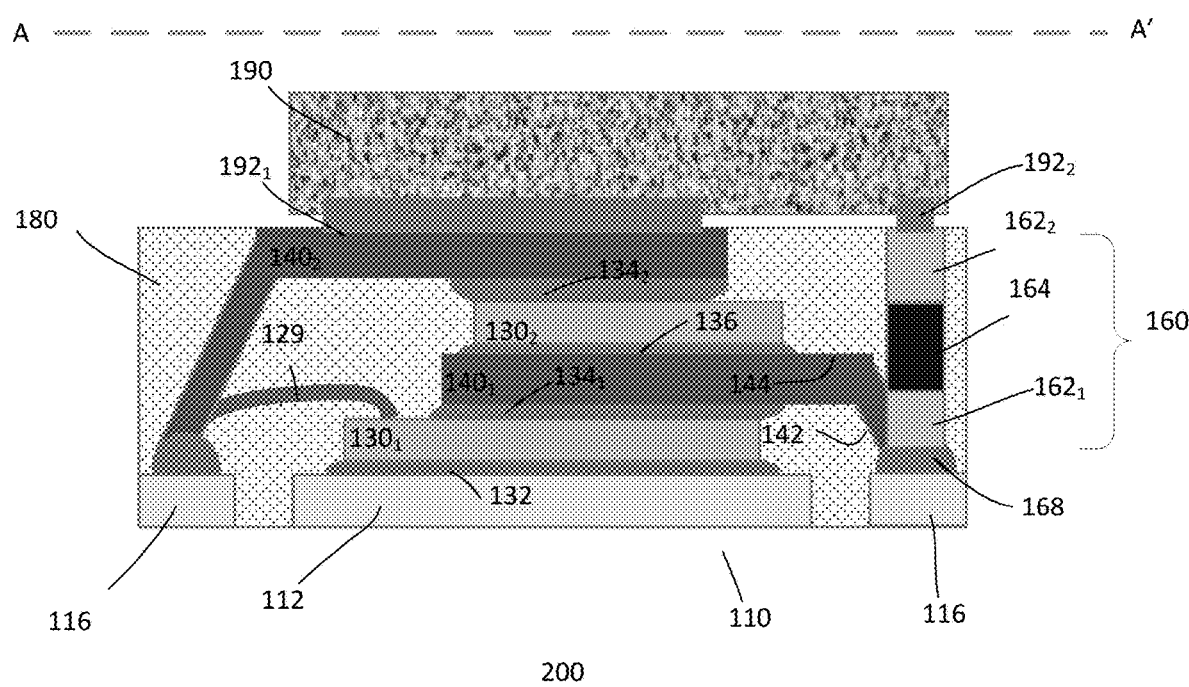
Fig. 2b$_{ii}$

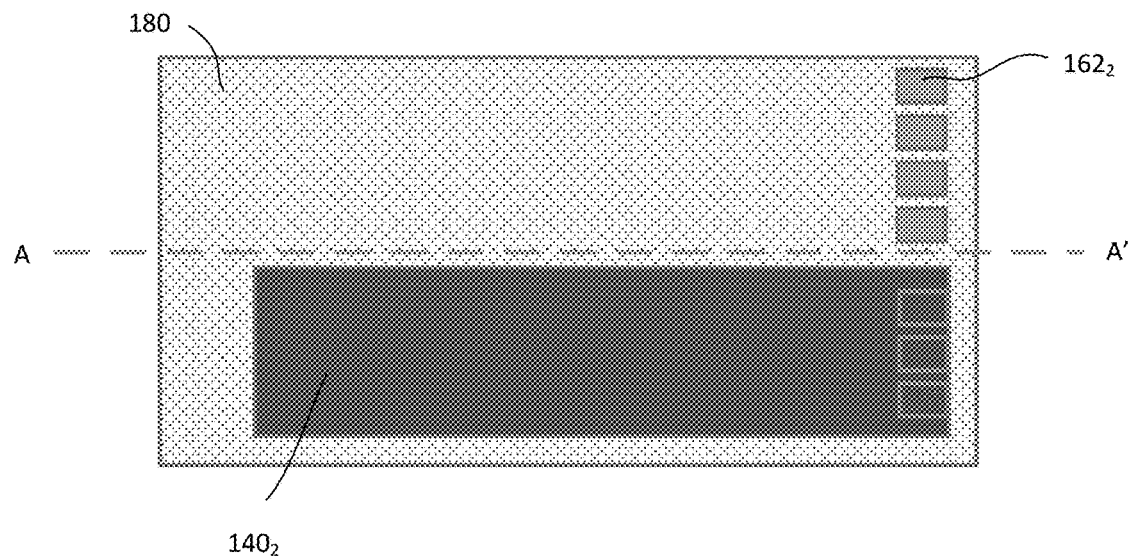
Fig. 3a$_i$
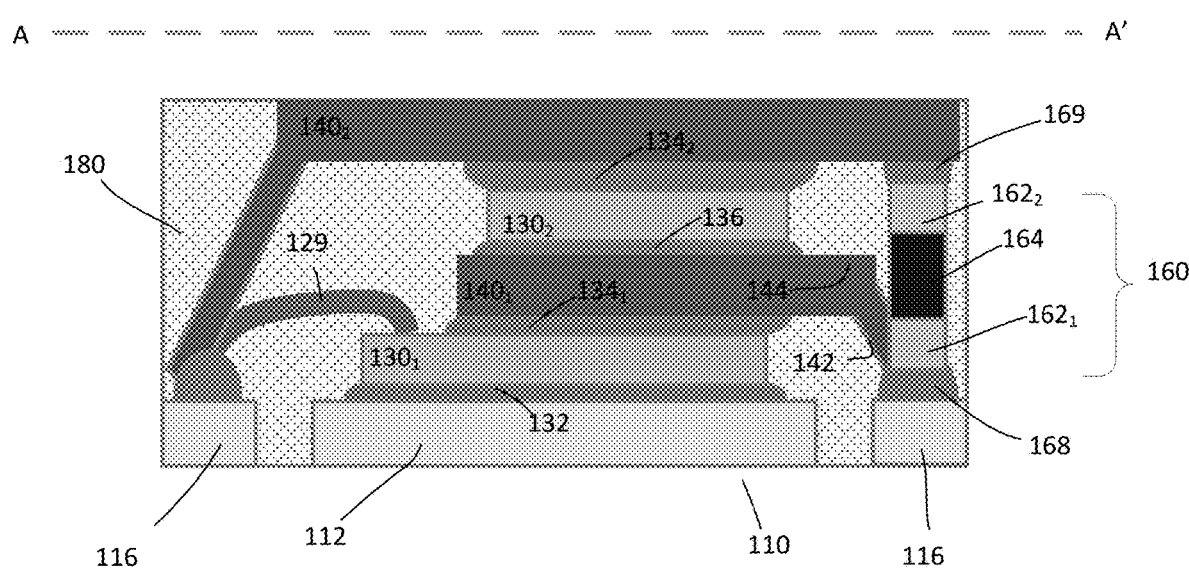
Fig. 3a$_{ii}$

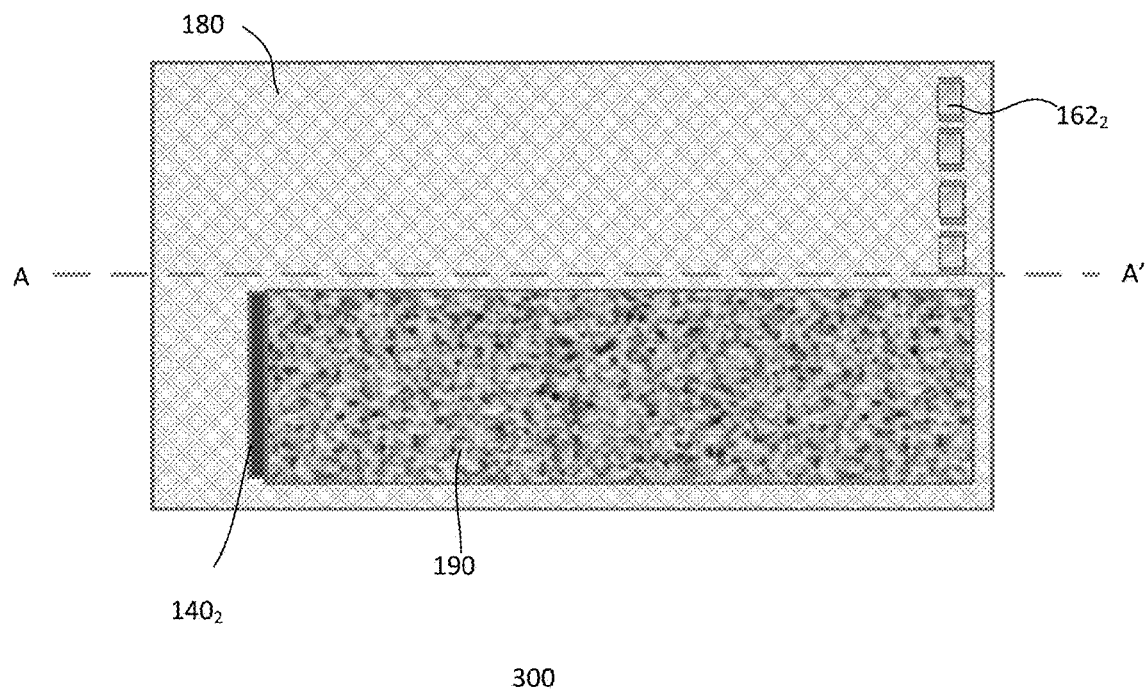
Fig. 3b$_i$
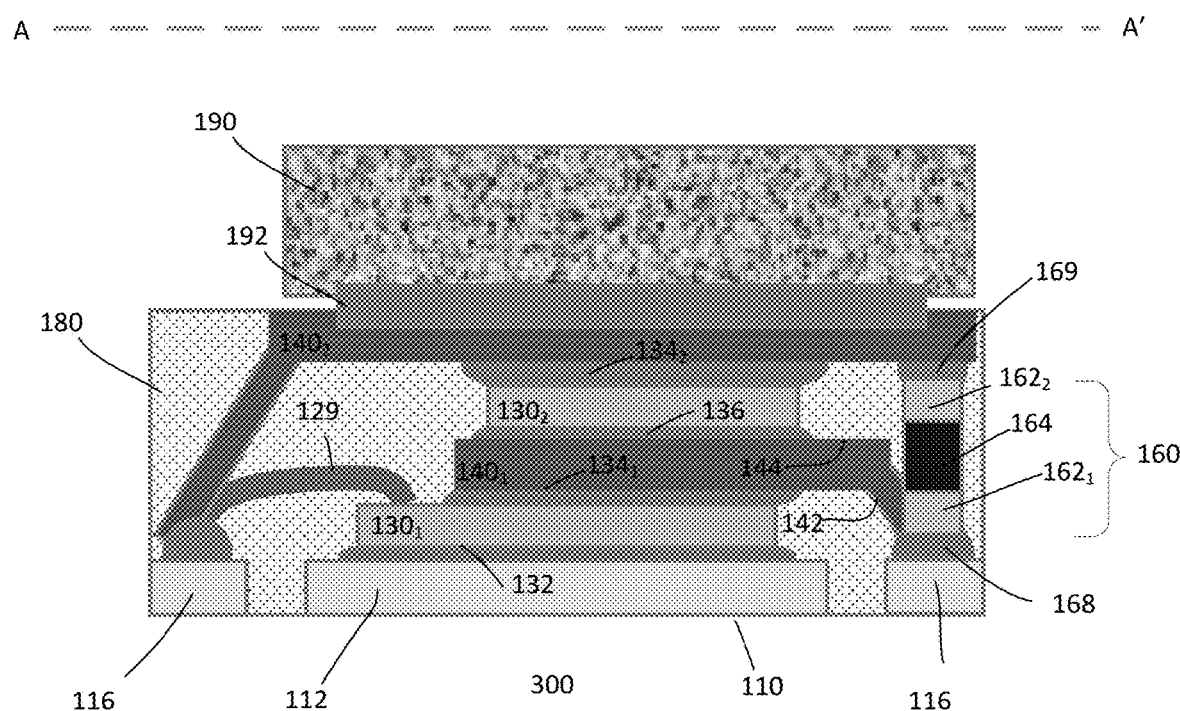
Fig. 3b$_{ii}$

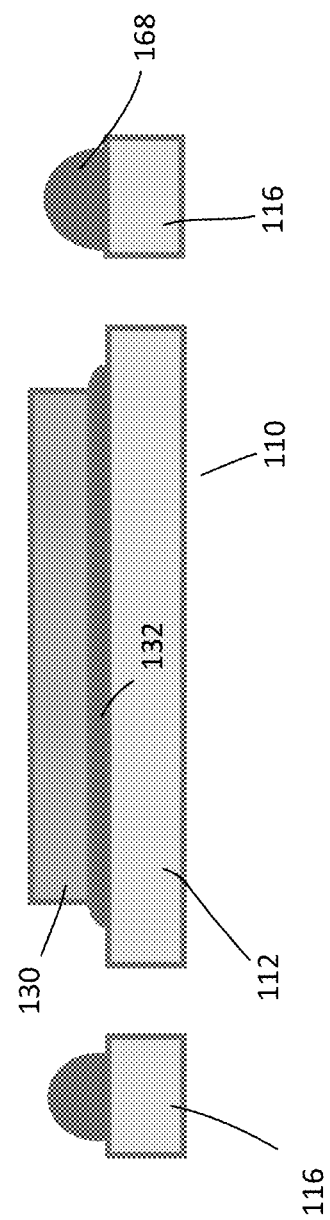

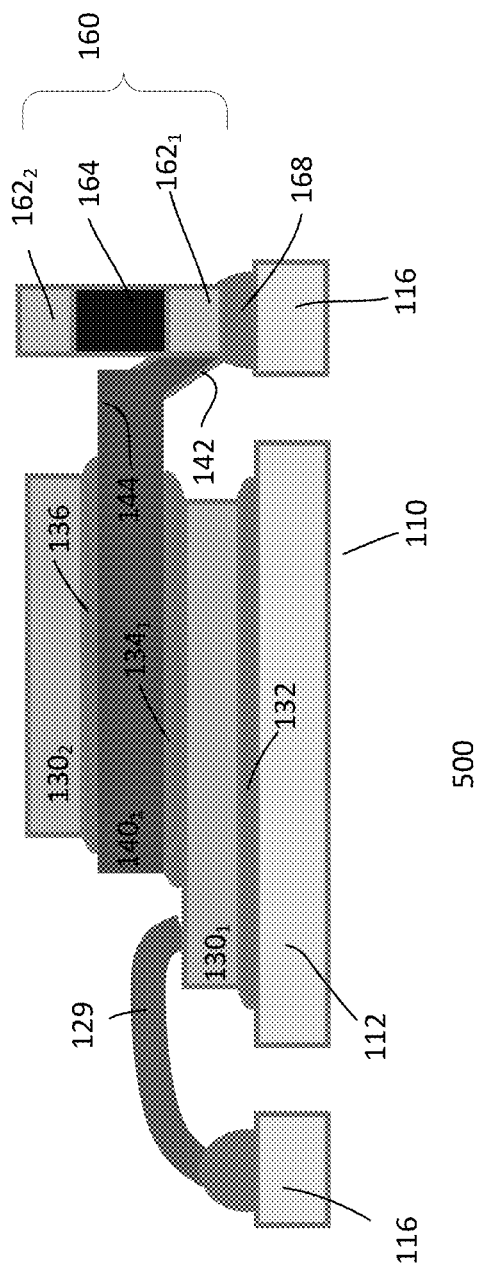

SEMICONDUCTOR PACKAGES WITH VERTICAL PASSIVE COMPONENTS

CROSS-REFERENCE TO RELATED APPLICATION

This application claims the benefit of U.S. Provisional Application Ser. No. 63/131,806, filed on Dec. 30, 2020, which is herein incorporated by reference in its entirety for all purposes.

FIELD OF THE INVENTION

The present invention generally relates to a semiconductor package. More specifically, the present invention is directed to a semiconductor package with a small footprint.

BACKGROUND

The recent rapid dissemination of smartphones and other mobile and wearable electronic terminals drives the demand for products that are more compact and power-efficient. To meet these requirements, multi-chip packages which offer performance improvements, compactness, and short time-to-market are often used.

However, multi-chip packages, particularly those which employ multiple passive components, such as resistors, capacitors and/or inductors, pose challenges. For example, the passive components are typically mounted in a lateral or side-by-side arrangement in the package, resulting in larger footprints. This reduces the overall competitive functionalities and compactness of the product.

Therefore, from the foregoing discussion, there is a desire to provide a stacked package with a small footprint.

SUMMARY

An embodiment related to a device is disclosed. The device includes a package substrate having top and bottom major package substrate surfaces and the top major package substrate surface includes an active package surface configured with a component attach region and terminal pads. The device further includes a component mounted onto the component attach region and the component is electrically coupled to the terminal pads. The device also includes a passive component with opposing first and second passive component terminals. The first passive component terminal is attached to the package substrate in a vertical configuration with the first passive component terminal attached to one terminal pad of the terminal pads, and the second passive component terminal is distal from the top major package substrate surface. The device also includes an encapsulant to form an encapsulated package.

Another embodiment related to a method for forming a device is disclosed herein. The method includes providing a package substrate having top and bottom major package substrate surfaces. The top major package substrate surface includes an active package surface configured with a component attach region and terminal pads. The method further includes disposing a component on the component attach region and the component is electrically coupled to the terminal pads. The method also includes attaching a passive component with opposing first and second passive component terminals to the package substrate. The first passive component terminal is attached to the package substrate in a vertical configuration with the first passive component terminal attached to one terminal pad of the terminal pads, and the second passive component terminal is distal from the top major package substrate surface. The method also includes depositing an encapsulant to form an encapsulated package.

In yet another embodiment, a device includes a package substrate having top and bottom major package substrate surfaces and the top major package substrate surface includes a component mounting region and terminal pads. The device also includes a component attached to the component mounting region and the component includes component pads connected to the terminal pads. A passive component with opposing first and second passive component terminals is attached to the package substrate in a vertical configuration with the first passive component terminal attached to one terminal pad of the terminal pads, and the second passive component terminal is distal from the top major package substrate surface.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. $1a_i$ to $1a_{ii}$ and $1b_i$ to $1b_{ii}$ show top and cross-sectional views along A-A' of an embodiment of a semiconductor package with and without an external component;

Figure 4B:
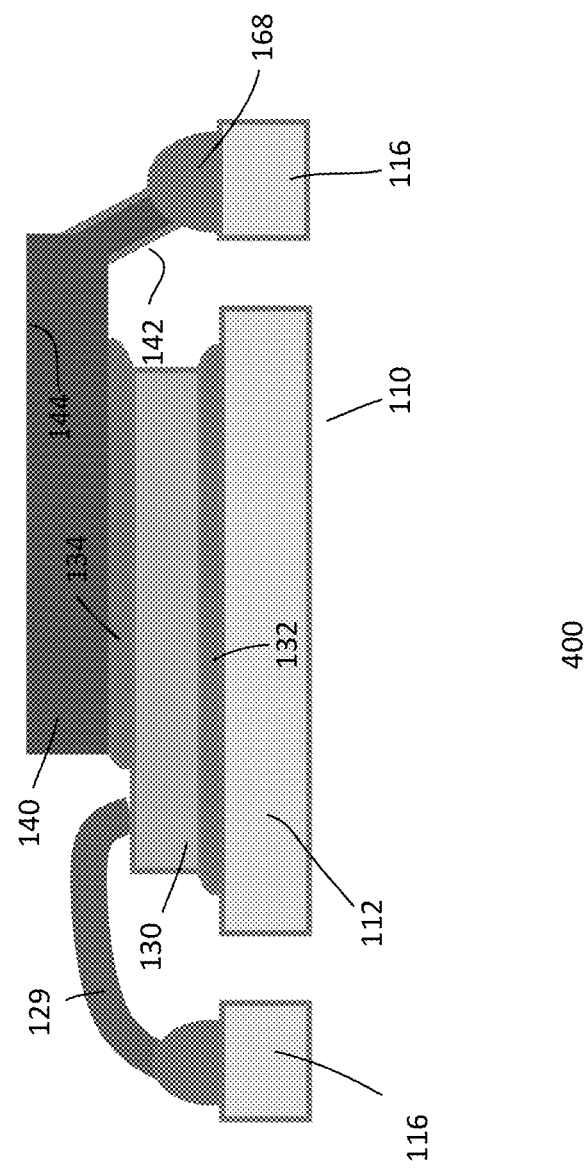

FIGS. $2a_i$ to $2a_{ii}$, and $2b_i$ to $2b_{ii}$ show top and cross-sectional views along A-A' of another embodiment of a semiconductor package with and without an external component;

FIGS. $3a_i$ to $3a_{ii}$ and $3b_i$ to $3b_{ii}$ show top and cross-sectional views along A-A' of another embodiment of a semiconductor package with and without an external component;

FIGS. 4a to 4f show an embodiment of a process for forming a semiconductor package;

FIGS. 5a to 5g show another embodiment of a process for forming a semiconductor package; and FIGS. 6a to 6d show another embodiment of a process for forming a semiconductor package.

DETAILED DESCRIPTION

Embodiments relate to semiconductor packages and methods for forming the semiconductor packages. The semiconductor package may be a stacked package. For example, the semiconductor package includes components, such as semiconductor dies or chips stacked together over a substrate, such as a package substrate. Other types of components, such as passive components or even other active components may also be possible. The components need not be the same type of components. In one embodiment, a second component is stacked over the first component which is disposed on top of the package substrate (e.g., the z direction). Providing a stacked package having more than 2 stacked components or other configurations of the components may also be useful. For example, the semiconductor package may include only one component connected to the substrate, a combination of stacked components and non-stack components or non-stack components.

In one embodiment, a first clip bond connects a first die to the substrate and a second clip bond connects a second die to the substrate. Alternatively, wire bonds may be employed to connect the dies to the substrate. In other embodiments, a combination of clip bonds and wire bonds may be employed to connect the dies to the substrate.

In one embodiment, the semiconductor package includes a passive component connected to the substrate in a vertical configuration. For example, a first terminal of the passive component is disposed on the substrate surface and another opposing second terminal faces away from the substrate. Coupling a passive component to the substrate in a vertical configuration reduces the footprint of the semiconductor package.

FIGS. $1a_i$ to $1a_{ii}$ show top and cross-sectional views along A-A' of an embodiment of a semiconductor package 100. The semiconductor package is, for example, a single active component semiconductor package. FIGS. $1b_i$ to $1b_{ii}$ show top and cross-sectional views along A-A' of the semiconductor package 100 with an external component disposed above the package.

As shown, the semiconductor package includes a package substrate 110 having opposing first and second major surfaces. The first major surface may be referred to as the top or active package surface and the second major surface may be referred to as the bottom package surface. Other designations for the surfaces may also be useful.

In one embodiment, the package substrate 110 is an electrically conductive chip carrier. The conductive chip carrier may be a lead frame, such as a copper (Cu) or copper alloy lead frame. Other types of conductive materials, such as aluminum (Al), nickel (Ni), silver (Ag), gold (Au), alloys thereof, or a combination thereof may also be used to form the lead frame. Providing other types of package substrates, including laminate package substrates, ceramic substrates and mold-based substrates, for the semiconductor package may also be useful.

The package substrate, as shown, is configured with a component-attach region 112 and package pads 116 or fingers. The package pads provide connections to the component pads of a component 130 of the package. In one embodiment, the component is a die or chip, such as an integrated circuit. Other types of components may also be useful. The number of package pads may depend on the configuration of the component and/or the package. The package pads may be disposed around the component-attach region. Other configurations of the package pads may also be useful. It is also understood that not all package pads are active package pads for connecting the component pads of the component. A package substrate may be designed to accommodate more than one type of die or component, providing design flexibility. In addition, the package substrate may be configured for other types of dies or components, such as flip chips.

As discussed, the component, in one embodiment, is a die. In such cases, the component-attach region is referred to as a die attach region. The die attach region is configured to accommodate the die 130. For example, a first or bottom die is attached to the die attach region of the package substrate. A die adhesive 132 may be used to attach the die to the die attach region. The die adhesive may be an adhesive tape or a thermal or UV curable adhesive. Other types of adhesives may also be used. In some cases, where the die attach region serves as a terminal or terminals, a conductive adhesive may be employed to connect the die attach region to a die pad on the bottom surface of the die (bottom die surface attached to the die attach region).

In one embodiment, the die pads on the active die surface are coupled to the package pads on the package substrate by a clip bond 140 and a wire bond 129. Providing more than one clip bond and/or wire bond may also be useful. In some cases, only clip bonds or only wire bonds may be used for coupling the die to the package substrate. Other configurations for connecting the first die to the package substrate may also be useful.

The clip bond, in one embodiment, is a metallic clip bond, such as a copper or copper alloy clip bond. The clip bond may be configured to have a stepped profile. For example, the clip bond includes a planar upper portion 144 and a riser portion 142. Having other profiles for the clip bond may also be useful. In addition, as shown, the riser portion is disposed on one side of the clip bond. Providing multiple riser portions may also be useful. The riser portions may be disposed on more than one side of the clip bond. In one embodiment, the clip bond may be patterned into multiple clip bonds. Other configurations of the clip bond may also be useful.

As shown, the planar upper portion of the clip bond is coupled to a die pad on the top die surface while a base of the riser portion is, for example, connected to a package pad. A conductive adhesive or bonding layer bonds the upper portion of the clip bond to a die pad on the top surface of the die. The bonding layer may be referred to as the clip-die (clip to die) bonding layer 134. In one embodiment, a conductive bonding layer bonds the base of the clip bond to a terminal pad of the package substrate. The conductive bonding layer may be referred to as the clip-substrate (clip to substrate) bonding layer 168.

In one embodiment, the clip-die and clip-substrate bonding layers are the same or similar to the die adhesive. For example, the bonding layers may include a conductive material with high thermal conduction, such as a solder paste or a sintering material. Preferably, the bonding layers may be formed of the same material. For example, the bonding layers may be solder paste or the same type of sintering material. This enables a single process for completing the bonds of the bonding layers. For example, in the case of a sintering paste, a curing process is performed while a reflow process is performed for a solder paste. For a sintering paste, a curing process may be performed in either a curing oven or a reflow oven. In some cases, different types of bonding layers may be employed. However, separate processes may be needed to complete the bonds.

On an opposing side of the riser portion of the clip bond, in one embodiment, a wire bond 129 is used to connect a die pad to another package pad. Providing more than one wire bond may also be useful. For example, clip bonds and wire bonds may be employed to connect the die to the package substrate. In other embodiments, only wire bonds or only clip bonds are employed to connect the die to the package substrate. Other configurations of connecting the die to the package substrate may also be useful.

The semiconductor package, in one embodiment, includes a passive component 160. In one embodiment, the passive component includes a passive component body 164 disposed between first and second passive component terminals $162_{1-2}$. For example, the passive component is arranged in a vertical configuration. The passive component, for example, may be a resistor, a capacitor or an inductor. Other types of passive components may also be useful. In other embodiments, the passive component may include a plurality of passive components with passive component bodies between first and second passive component terminals. As shown, the passive component includes 8 passive components. Other numbers or configurations of the passive components may also be useful.

In one embodiment, the first passive component terminals of the passive components are coupled to package pads, for example, by a conductive passive component-substrate bonding layer, similar to the bonding layers used to bond the clip bond to the die and package substrate. The first passive component terminals may share package pads with the clip bond. For example, the clip bond may share common package pads with the first passive component terminals. Other configurations of the passive component or components and clip bond may also be useful. For example, the clip bond may only share one or some terminal pads with one or some of the passive components.

The second passive component terminals, in one embodiment, extend above the top surface of the clip bond. For example, the second passive component terminals may extend about not more than 50 microns above the top of the clip bond. Providing second passive component terminals which extend by other heights above or even planar with the top surface of the clip bond may also be useful.

In one embodiment, an encapsulant 180 covers the package substrate, the die, the wire bond and the clip bond. The encapsulant, for example, may be a mold compound. The encapsulant may be formed by, for example, transfer molding, compression molding or other techniques. Other techniques for forming the encapsulant may also be useful.

As shown, the encapsulant includes a planar top surface disposed below the top surface of the second passive component terminals. For example, the top surface of the encapsulant is about at least 25 microns below a top surface of the second passive component terminals. Providing the top surface of the encapsulant by other distances may also be useful. This leaves the top surface of the second passive component terminals exposed. By exposing the second passive component terminals, they can be electrically connected to other connections. For example, they can be electrically connected to a top or external component disposed above the encapsulated package as shown in FIGS. $1b_i$ and $1b_{ii}$.

As described, the semiconductor package includes passive components which are arranged in a vertical configuration. Such an arrangement advantageously reduces a package footprint of the semiconductor package and at the same time provides more functionalities and increases processing efficiency of the package.

Referring to FIGS. $1b_i$ and $1b_{ii}$, the top component, for example, is an external component 190 disposed above the encapsulated package. The external component may be, for example, another die, component, or a package. In the case of a component, the component can be another passive component, a heat spreader, or a shielding component such as an electromagnetic interference (EMI) shield. Other types of external components may also be useful. In one embodiment, the external component includes external component pads on the bottom component surface. The bottom component surface of the external component, for example, may be the active component surface with the external component pads. Providing different configurations or other numbers of the external component may also be possible.

As shown, the external component is electrically connected to the encapsulated package via the passive components. For example, exposed second passive component terminals of the passive components are connected to the external component pads disposed on the bottom component surface of the external component. In one embodiment, a conductive external component-passive component bonding layer 192 is used to bond the external component pads of the external component to the second passive component terminals of the passive component. The conductive external component-passive component bonding layer, for example, may be similar to the bonding layers used to bond the clip bond to the die and the package substrate.

Illustratively, the external component is connected to 7 passive components. Other numbers or configurations of connecting the passive components may also be useful. For example, it is understood that even though there may be multiple passive components, not all have to be electrically connected to the external component. Additionally, in the case that there is more than one external component, one or some passive components may be connected to one or some of the external components. Other configurations for connecting the external component or external components to the encapsulated package may also be possible. For example, a top surface of the first clip bond may also be exposed to connect to one or some of the external components. This increases the functionality of the package.

As described, the package is a single component package, and an external component is disposed thereover. However, it is understood that the package itself may include more than one component and/or chip configured in a stack configuration or a combination of a stacked (e.g., the z direction) and a planar configuration. Having a package with other configurations may also be possible.

FIGS. $2a_i$ to $2a_{ii}$ show top and cross-sectional views along A-A' of another embodiment of a semiconductor package 200 and FIGS. $2b_i$ to $2b_{ii}$ show top and cross-sectional views along A-A' of an embodiment of the semiconductor package 200 with an external component disposed thereover.

The package is similar to that described in FIGS. $1a_i$ to $1b_{ii}$. Common elements may not be described or described in detail. However, unlike FIGS. $1a_i$ to $1b_{ii}$, the package includes a multi-component stack. For example, the multi-component stack is a multi-die stack with a second die stacked on a first die. Providing other numbers or types of stacked components may also be useful.

As shown, a second die $130_2$ is stacked on top of a first die $130_1$. For example, the package includes a multi-die stack configuration, with clip bonds for coupling to the first die and to the second die. Although a two-die stack is illustrated, providing a die stack having other numbers of dies may also be useful. The first die is attached to the die attach region of the package substrate using a die adhesive 132. A first clip bond $140_1$ connects a die pad on the top die surface of the first die to a package pad on the package substrate. For example, a clip-die conductive bonding layer 1341 bonds the first clip bond to the die pad and a clip-substrate conductive bonding layer 168 bonds the first clip bond to the package pad. Apart from the first clip bond, the first die may also include a wire bond 129 for electrically coupling another die pad on the top die surface to the package substrate. For example, a combination of clip bonds and wire bonds may be provided to connect the die pads to respective package pads. Furthermore, depending on the number of die pads on the first die, more than one wire bond and/or first clip bond may be employed.

The second die is attached to a top surface of the upper planar portion 144 of the first clip bond by a die-clip (die to clip) conductive bonding layer 136. The first clip bond, for example, provides a common signal to both the first and second dies. For example, the second die has a die pad on its bottom die surface which is coupled to the first clip bond.

A second clip bond $140_2$ is provided to electrically connect the second die to the package substrate. The second clip bond may have any profile, as previously described. For example, the second clip bond may be configured with a planar upper portion and a riser portion. A second clip-die conductive bonding layer $134_2$ bonds the second clip bond to a die pad on a top surface of the second die and a second clip-substrate bonding layer bonds a base of the riser portion of the second clip bond to another package pad of the package substrate. The bases of the first and second clip bonds are bonded to respective package pads. In addition, the second clip bond may include multiple second clip bonds, depending on the number of die pads on the top surface of the second die to be connected.

Although the package is shown with a combination of wire bond and clip bonds for coupling the dies to the package substrate, it is understood that only clip bonds or only wire bonds may be used to electrically connect the dies to the package substrate. Other configurations of connecting the dies to the package substrate may also be useful.

The semiconductor package, in one embodiment, includes a passive component. In one embodiment, the passive component includes a passive component body 164 disposed between first and second passive component terminals $162_{1-2}$. For example, the passive component is arranged in a vertical configuration. The passive component, for example, may be a resistor, a capacitor, or an inductor. Other types of passive components may also be useful. In other embodiments, the passive component may include a plurality of passive components with passive component bodies between first and second passive component terminals. As shown, the passive component includes 8 passive components. Other numbers or configurations of the passive components may also be useful.

In one embodiment, the first passive component terminals of the passive components are coupled to package pads, for example, by a conductive passive component-substrate bonding layer, similar to the bonding layers used to bond the clip bond to the die and package substrate. The first passive component terminals may share package pads with the clip bond. For example, the clip bond may share common package pads with the first passive component terminals. Other configurations of the passive component or components and clip bond may also be useful. For example, the clip bond may only share one or some terminal pads with one or some of the passive components.

The second passive component terminals, in one embodiment, extend to a same height as the top surface of the second clip bond. For example, a top of the second passive component terminals is planar with the top of the second clip bond. Providing second passive component terminals which extend by other heights above or below the top surface of the second clip bond may also be useful.

An encapsulant 180 is disposed on the package substrate. The encapsulant covers the package substrate, the die stack, the wire bond and the clip bonds. In one embodiment, the encapsulant may be a mold compound formed by, for example, transfer molding, compression molding or other techniques.

As shown, the encapsulant includes a planar top surface just below the top surface of the second clip bond and the top surface of the second passive component terminals. For example, the top surface of the encapsulant is about 25 microns below a top surface of the second clip bond and the second passive component terminals. Providing the top surface of the encapsulant by other distances may also be useful. This leaves the top surface of the second clip bond and the second passive component terminals exposed so that they can be electrically connected to other connections. Such an arrangement advantageously reduces footprint and also increases package efficiency and functionality. For example, they can be electrically connected to a top component disposed above the encapsulated package as shown in FIGS. $2b_i$ and $2b_{ii}$.

Referring to FIGS. $2b_i$ and $2b_{ii}$, the top component, for example, is an external component 190 disposed above the encapsulated package. The external component may be, for example, another die, component, or a package. In the case of a component, the component can be another passive component, a heat spreader, or a shielding component such as an electromagnetic interference (EMI) shield. In one embodiment, the external component includes external component pads on the bottom component surface. The bottom component surface of the external component, for example, may be the active component surface with the external component pads. Providing different configurations or other numbers of the external component may also be possible.

In one embodiment, the external component is electrically connected to the encapsulated package. For example, the external component is coupled to the second clip bond and passive components of the encapsulated package. As shown, the external component is attached to a top surface of the upper portion of the second clip bond $140_2$ by a conductive external component-clip bonding layer $192_1$. The second clip bond, for example, provides a common signal to the external component and the second die. For example, the external component has an external component pad on its bottom component surface which is coupled to the second clip bond.

As for the passive components, they may be connected to the external component via their second passive component terminals. For example, the external component is coupled to the second passive component terminals of the second passive components by a conductive external component-passive component bonding layer $192_2$. The bonding layer used to bond the external component to the passive component may be similar to those used to bond the external component to the clip bond and/or the clip bond to the die and the package substrate. Illustratively, the external component is connected to 8 passive components. Other numbers or configurations of connecting the passive components may also be useful. For example, it is understood that even though there may be multiple passive components, not all have to be electrically connected to the external component. Additionally, in the case that there is more than one external component, one or some of the external components may be connected to the second clip bond and/or one or some passive components. Other configurations for connecting the external component or external components to the encapsulated package may also be possible.

FIGS. $3a_i$ to $3a_{ii}$ show top and cross-sectional views along A-A' of another embodiment of a semiconductor package 300 and FIGS. $3b_i$ to $3b_{ii}$ show top and cross-sectional views along A-A' of the semiconductor package 300 with an external component disposed thereover.

The package is similar to that described in FIGS. $2a_i$ to $2b_{ii}$. For example, the package includes a multi-die stack with a second die $130_2$ stacked on a first die $130_1$. A combination of a wire bond 129 and first and second clip bonds $140_{1-2}$ is provided to connect the dies to the package substrate 110. Common elements may not be described or described in detail.

The package also includes a passive component 160 arranged in a vertical configuration. The passive component, in one embodiment, includes a plurality of passive components with passive component bodies between first and second passive component terminals. As shown, the passive component includes 7 passive components. Other numbers or configurations of the passive components may also be useful. The first passive component terminals of the passive components are, for example, coupled to package pads 116 of the package substrate.

However, unlike FIGS. $2a_i$ to $2b_{ii}$, the second passive component terminals extend to a height just below the bottom surface of a second clip bond $140_2$. In one embodiment, the second clip bond may be coupled to the second passive component terminals when attached. For example, a planar upper portion of the second clip bond is attached to the second passive component terminals by a conductive clip-passive component bonding layer 169. As shown, the second clip bond is coupled to 3 second passive component terminals. Other numbers or configurations of connecting the passive components may also be useful. It is understood that even though there may be multiple passive components, not all have to be electrically connected to the second clip bond. Furthermore, those not connected to the second clip bond may extend to a height that is planar or just above the top surface of the second clip bond. Having other configurations for the passive components may also be useful.

In one embodiment, the encapsulant 180 covers the package substrate, the die stack, the wire bond, and the clip bonds. As shown, the encapsulant includes a planar top surface just below the top surface of the second clip bond and the top surface of the second passive component terminals not coupled to the second clip bond. For example, the top surface of the encapsulant is about 25 microns below a top surface of the second clip bond. Providing the top surface of the encapsulant by other distances may also be useful. This leaves the top surface of the second clip bond exposed to electrically couple to other connections. For example, it can be electrically connected to a top component disposed above the encapsulated package as shown in FIGS. $3b_i$ and $3b_{ii}$. In addition, the second passive component terminals not coupled to the second clip bond may also be exposed to electrically couple to other connections. In such cases, they can be configured to extend to a height that is planar or just above the top surface of the second clip bond.

Referring to FIGS. $3b_i$ and $3b_{ii}$, the top component is, for example, an external component 190 disposed above the encapsulated package. The external component may be, for example, another die, component or even a package. In the case of a component, the component can be another passive component, a heat spreader, or a shielding component such as an electromagnetic interference (EMI) shield. The bottom component surface of the external component, for example, may be the active component surface with the external component pads. Providing different configurations or other numbers of the external component may also be possible.

In one embodiment, the external component is electrically connected to the encapsulated package. For example, the external component 190 is coupled to the second clip bond $140_2$ of the encapsulated package. As shown, the external component is attached to a top surface of the upper portion of the second clip bond by a conductive external component-clip bonding layer 192. The second clip bond, for example, provides a common signal to the external component and the second die. For example, the external component has an external component pad on its bottom component surface which is coupled to the second clip bond. In the case that there is more than one external component, one or some of the external components may be connected to the second clip bond and/or one or some passive components not coupled to the second clip bond. Other configurations for connecting the external component or external components to the encapsulated package may also be possible.

FIGS. 4a to 4f show an embodiment of a process 400 for forming a semiconductor package. The semiconductor package is, for example, a single component semiconductor package which is similarly described in FIGS. $1a_i$ to $1b_{ii}$. Common elements may not be described or described in detail.

Referring to FIG. 4a, the process 400 begins by providing a package substrate 110. The package substrate includes opposing top and bottom substrate surfaces. The package substrate serves as an electrically conductive chip carrier for the package. The conductive chip carrier may be a lead frame. The lead frame may be configured for a leadless package, such as a QFN package. The lead frame may also be configured for other types of packages.

The package substrate or lead frame includes a component-attach region 112 on which a component 130 is attached. In one embodiment, the component is a die or chip, such as an integrated circuit. Other types of components such as a package may also be possible. In cases when the component is a die, the component-attach region is referred to as a die attach region. As shown, a first die 130 is attached to the die attach region of the package substrate by a die adhesive 132. Other configurations of the package substrate may also be useful. For example, the package substrate may be configured to accommodate more than one die such as a multi-die stack. In addition, a package substrate may be designed to accommodate more than one type of die, providing design flexibility.

The package substrate may be configured with a plurality of package pads 116. The package pads provide connections to the die pads of a die of the package. The number of package pads may depend on the configuration of the die and/or the package. The package pads may be disposed around the die-attach region. Other configurations of the package pads may also be useful. It is also understood that not all package pads are active package pads for connecting the die pads of the die.

In FIG. 4b, a clip bond 140 is provided to electrically couple a die pad on the top die surface to a package pad of the package substrate. The clip bond, for example, is a metallic clip bond, such as a copper or copper alloy clip bond. The clip bond may be configured to have a stepped profile. For example, the clip bond includes a planar upper portion 144 and a riser portion 142. The planar upper portion is coupled to a die pad on the top die surface while a base of the riser portion, for example, connects to a package pad. Having other profiles for the clip bond may also be useful. In addition, as shown, the riser portion is disposed on one side of the clip bond. Providing multiple riser portions may also be useful. In one embodiment, the clip bond may be patterned into multiple clip bonds. Other configurations of the clip bond may also be useful.

Conductive bonding layers are employed to bond the clip bond to the die and the package substrate. For example, a clip-die bonding layer 134 bonds the upper portion of the clip bond to the die pad on the top die surface and a clip-substrate bonding layer 168 bonds the base of the clip bond to a package pad of the package substrate. The bonding layers may include a conductive material with high thermal conduction, such as a solder paste or a sintering material. Preferably, the bonding layers may be formed of the same material. For example, the bonding layers may be solder paste or the same type of sintering material. This enables a single process for completing the bonds of the bonding layers. For example, in the case of a sintering paste, a curing process is performed while a reflow process is performed for a solder paste. For a sintering paste, a curing process may be performed in either a curing oven or a reflow oven. In some cases, different types of bonding layers may be employed. However, separate processes may be needed to complete the bonds.

On an opposing side of the riser portion of the clip bond, a wire bond 129 is provided to couple a die pad on the top die surface to another package pad. The wire bond may be formed before or after the clip bond is attached or even after a passive component is attached in FIG. 4c. Further, depending on the design or applications of the package, more than one clip bond and/or wire bond may also be used. In some cases, only clip bonds or only wire bonds may be used for coupling the die to the package substrate. Other configurations of connecting the first die to the package substrate may also be useful.

Figure 4C:
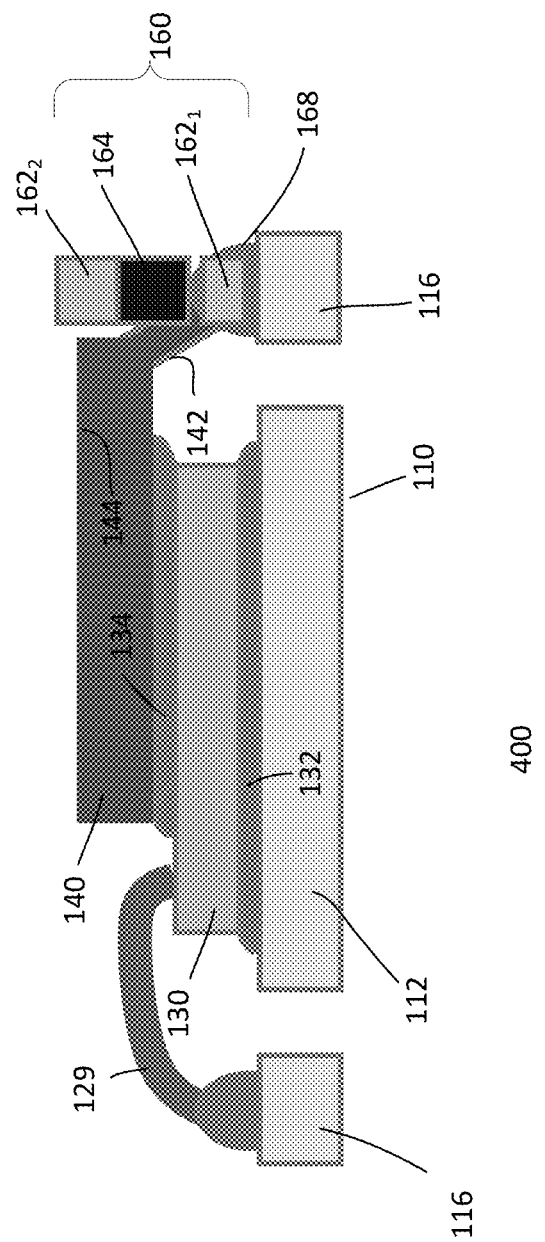

In FIG. 4c, a passive component 160 is attached to the package substrate. The passive component is arranged in a vertical configuration. In one embodiment, the passive component includes a passive component body 164 disposed between first and second passive component terminals $162_{1-2}$. The passive component, for example, may be a resistor, a capacitor or an inductor. Other types of passive components may also be useful. In other embodiments, the passive component may include a plurality of passive components with passive component bodies between first and second passive component terminals. For example, the passive component may include 8 passive components. Other numbers or configurations of the passive components may also be useful.

In one embodiment, the first passive component terminals of the passive components are coupled to package pads, for example, by a conductive passive component-substrate bonding layer, similar to the bonding layers used to bond the clip bond to the die and package substrate. The first passive component terminals may share package pads with the clip bond. For example, the clip bond may share common package pads with the first passive component terminals. Other configurations of the passive component or components and clip bond may also be useful. For example, the clip bond may only share one or some terminal pads with one or some of the passive components.

The second passive component terminals, in one embodiment, extend above the top surface of the clip bond. For example, the second passive component terminals may extend about not more than 50 microns above the top of the clip bond. Providing second passive component terminals which extend by other heights above or even planar with the top surface of the clip bond may also be useful.

Figure 4D:
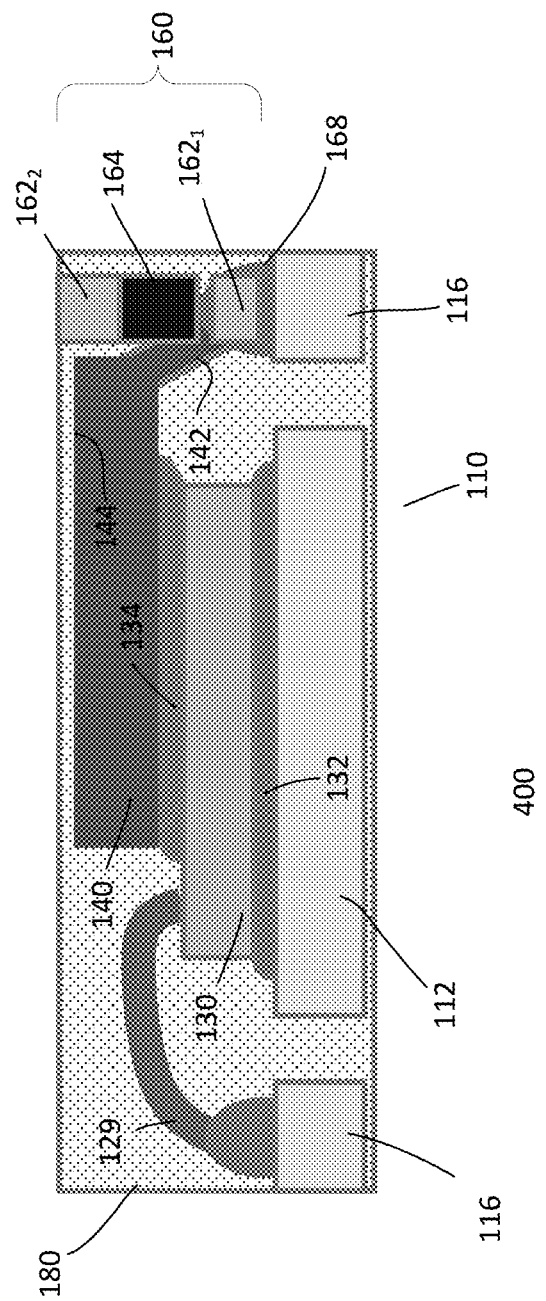

In FIG. 4d, an encapsulant 180 is disposed on the package substrate to cover the die, the wire bond and the clip bond. The encapsulant, for example, may be a mold compound. The encapsulant may be formed by, for example, transfer molding, compression molding or other techniques. Other techniques for forming the encapsulant may also be useful.

As shown, the encapsulant includes a planar top surface disposed below a top surface of the second passive component terminals. For example, the top surface of the encapsulant is about 25 microns below the top surface of the second passive component terminals. Providing the top surface of the encapsulant by other distances may also be useful. This leaves the top surface of the second passive component terminals exposed. By exposing the second passive component terminals, they can be electrically connected to other connections. For example, they can be electrically connected to a top component disposed above the encapsulated package.

Figure 4E:
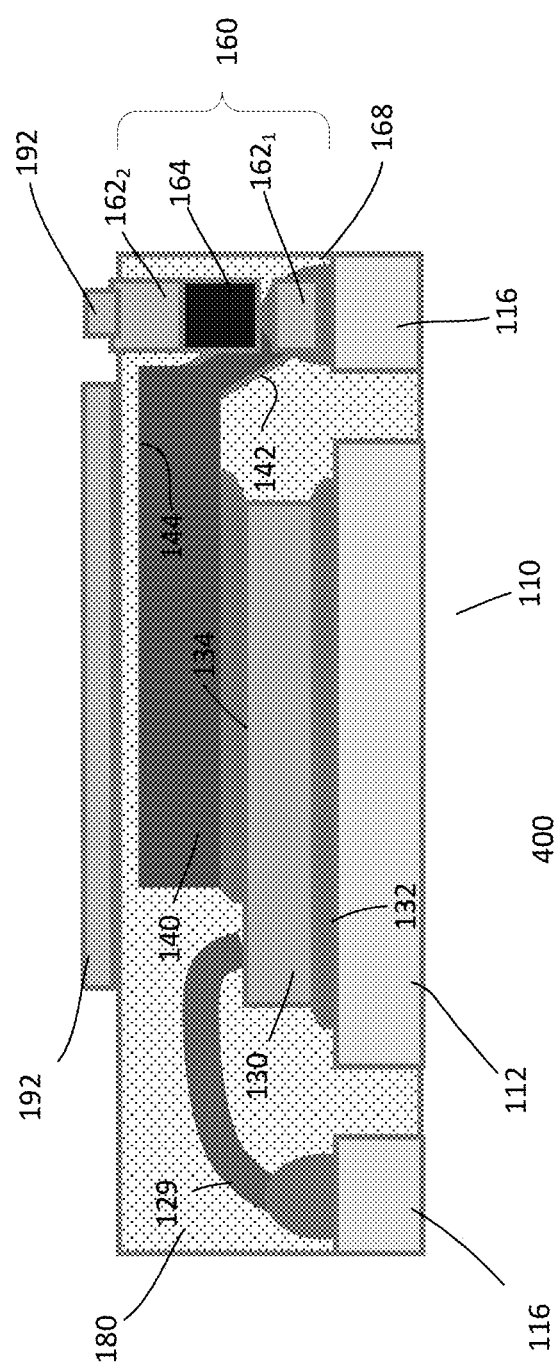

Referring to FIG. 4e, the process continues by depositing a conductive external component-passive component bonding layer 192 over the top surface of the package. In one embodiment, the external component-passive component bonding layer is patterned to cover a portion of the top surface of the encapsulant and the exposed second passive component terminals. The bonding layer may be similar to the bonding layers used for bonding the clip bond to the package substrate and the die.

Figure 4F:
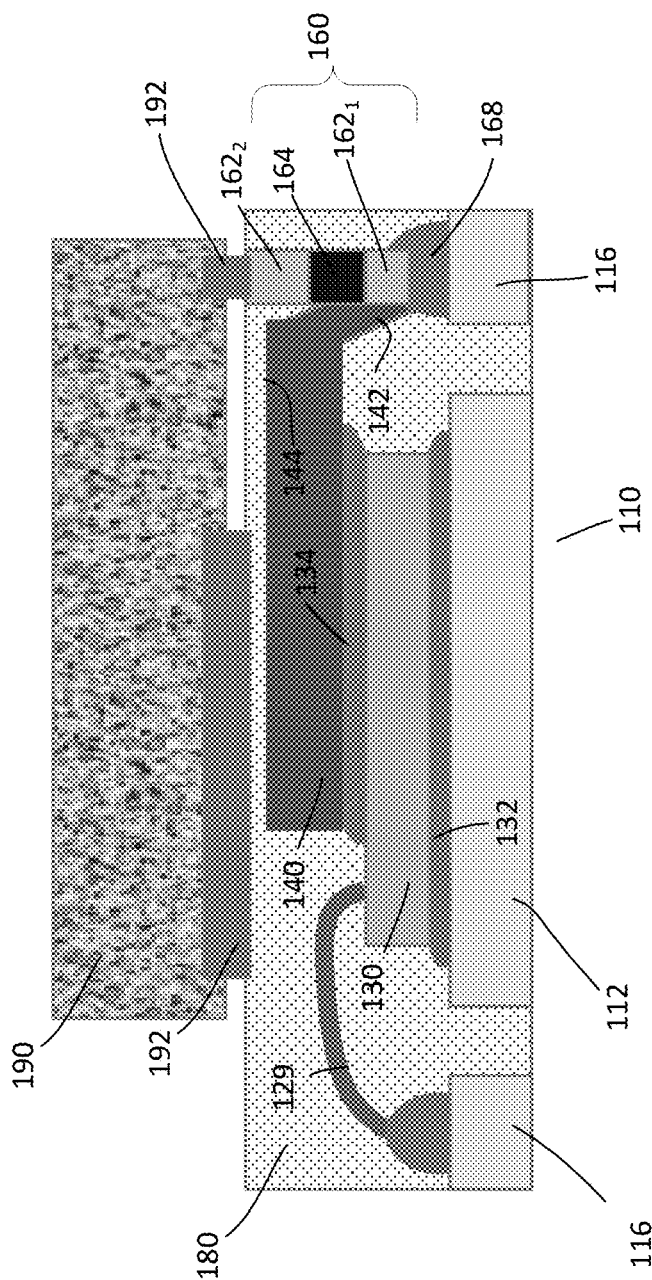

In FIG. 4f, a top component is attached to the encapsulated package. The top component, for example, is an external component 190 disposed above the encapsulated package. The external component may be, for example, another die, component or even a package. In the case of a component, the component can be another passive component, a heat spreader, or a shielding component such as an electromagnetic interference (EMI) shield. In one embodiment, the external component includes external component pads on the bottom component surface. The bottom component surface of the external component, for example, may be the active component surface with the external component pads. Providing different configurations or other numbers of the external component may also be possible.

As shown, the external component is electrically connected to the encapsulated package via the passive components. For example, the conductive external component-passive component bonding layer is used to bond the external component pads of the external component to the second passive component terminals of the passive component. It is understood that even though there may be multiple passive components, not all have to be electrically connected to the external component. For example, the external component may only be connected to one or some passive components. Additionally, in the case that there is more than one external component, one or some passive components may be connected to one or some of the external components. Other configurations for connecting the external component or external components to the encapsulated package may also be possible. For example, a top surface of the first clip bond may also be exposed to connect to one or some of the external components. This increases the functionality of the package.

As described, the package is, for example, a single active component package, and an external component is disposed thereover. However, it is understood that the package itself may include more than one component and/or chip configured in a stack configuration or a combination of a stacked (e.g., the z direction) and a planar configuration. Having a package with other configurations may also be possible.

FIGS. 5a to 5g show another embodiment of a process 500 for forming a semiconductor package. The package includes, for example, a multi-die stack which is similar to that described in FIGS. $2a_i$ to $2b_{ii}$. Common elements may not be described or described in detail.

Figure 5A:
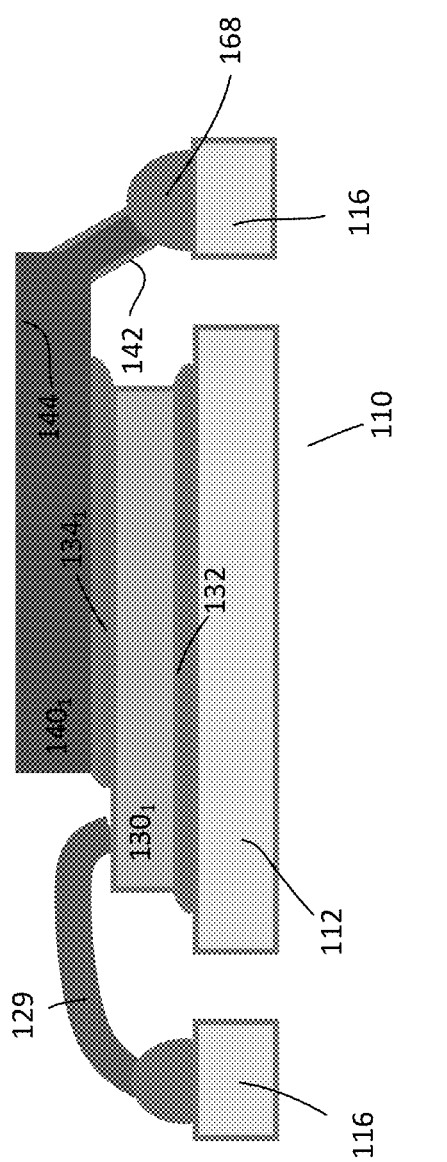

Referring to FIG. 5a, it is at the stage of processing similar to that described in FIG. 4b. As shown, a first die 130₁ is attached to the die attach region 112 of the package substrate 110. A combination of a wire bond 129 and a first clip bond 140₁ is used to couple die pads of the first die to respective package pads on the package substrate. Other configurations for electrically connecting the first die to the package substrate may also be useful. In addition, it is understood that the wire bond may be formed before or after the first clip bond is attached or even after the attachment of a passive component in subsequent steps.

Figure 5B:
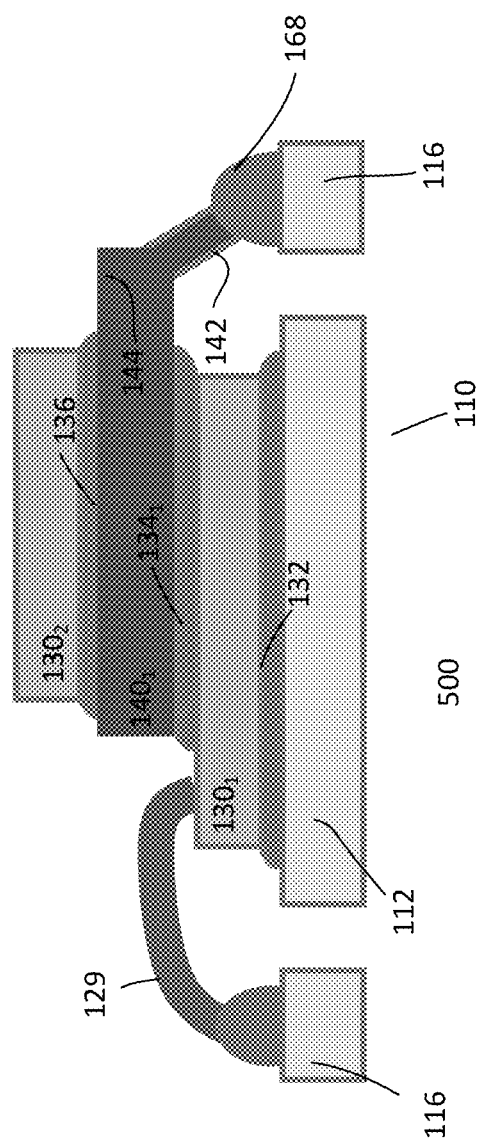

In FIG. 5b, a second die $130_2$ is disposed over the first die to form a die stack. For example, the second die is attached to an upper portion of the first clip bond $140_1$ by a die-clip bonding layer 136.

A passive component 160 is attached to the package substrate in FIG. 5c. The passive component is arranged in a vertical configuration. In one embodiment, the passive component may include a plurality of passive components with passive component bodies between first and second passive component terminals. For example, the passive component may include 8 passive components. Other numbers or configurations of the passive components may also be useful. As shown, the first passive component terminals of the passive components are coupled to package pads of the package substrate.

Figure 5D:
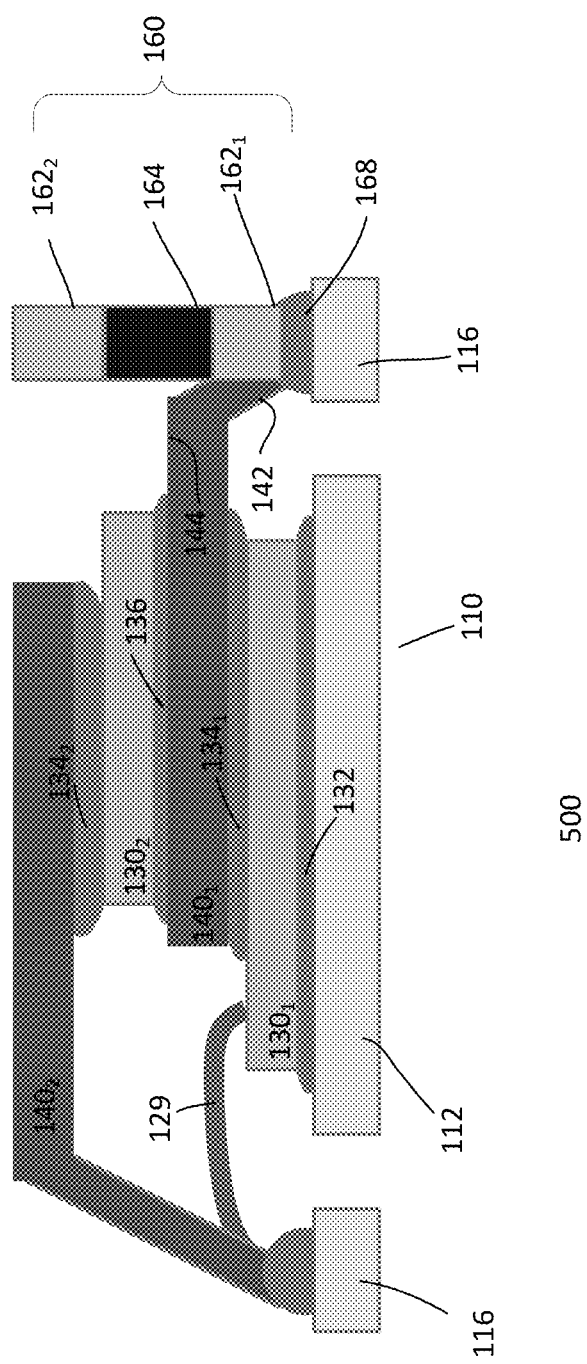

In FIG. 5d, a second clip bond $140_2$ is provided thereafter to electrically connect the second die $130_2$ to the package substrate. The second clip bond may have any profile, as previously described. For example, the second clip bond may be configured with a planar upper portion and a riser portion. A second clip-die conductive bonding layer $134_2$ bonds the second clip bond to a die pad on a top surface of the second die and a second clip-substrate bonding layer bonds a base of the riser portion of the second clip bond to another package pad of the package substrate.

The second clip bond, as shown, is planar with a top of the second passive component terminals when attached. For example, the second passive component terminals, in one embodiment, extend to the same height as the top surface of the second clip bond. Providing second passive component terminals which extend by other heights above or below the top surface of the second clip bond may also be useful.

Figure 5E:
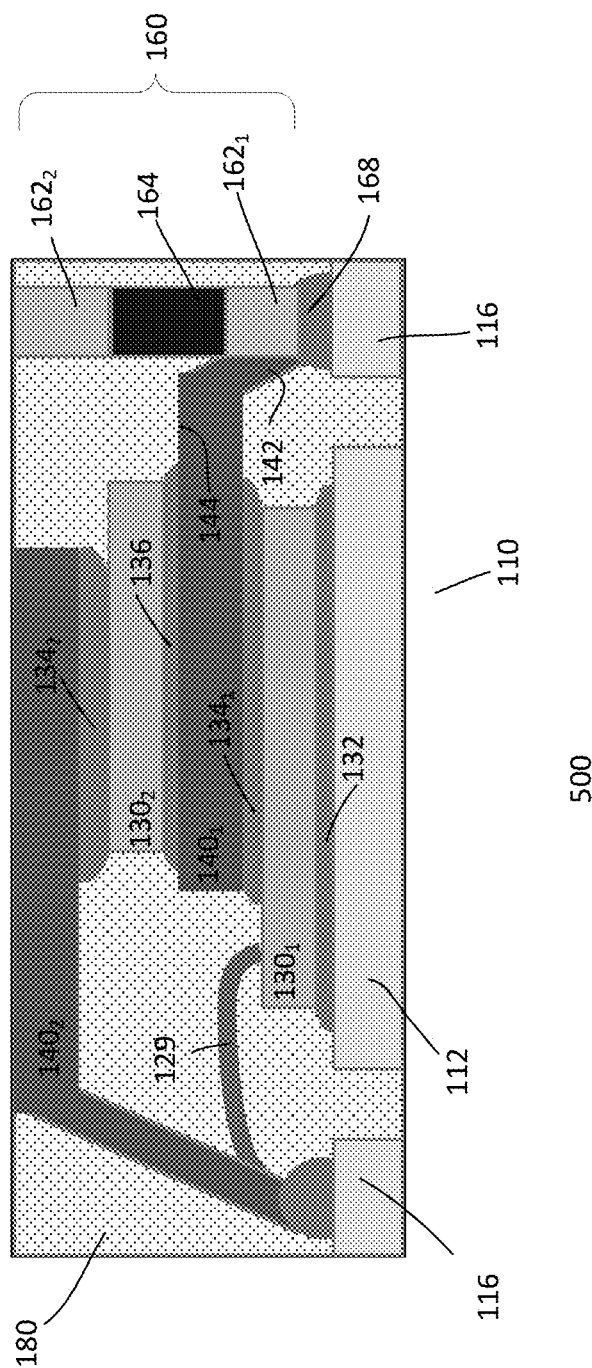

The package is encapsulated in FIG. 5e. For example, an encapsulant 180 such as a mold compound, is disposed on the package substrate. The encapsulant covers the package substrate, the die stack, the wire bond, and the clip bonds. In one embodiment, the encapsulant includes a planar top surface just below the top surface of the second clip bond and the top surface of the second passive component terminals. For example, the top surface of the encapsulant is about 25 microns below the top surfaces of the second clip bond and the second passive component terminals. Providing the top surface of the encapsulant by other distances may also be useful. This leaves the top surfaces of the second clip bond and the second passive component terminals exposed so that they can be electrically connected to other connections. For example, they can be electrically connected to a top component disposed above the encapsulated package.

Figure 5F:
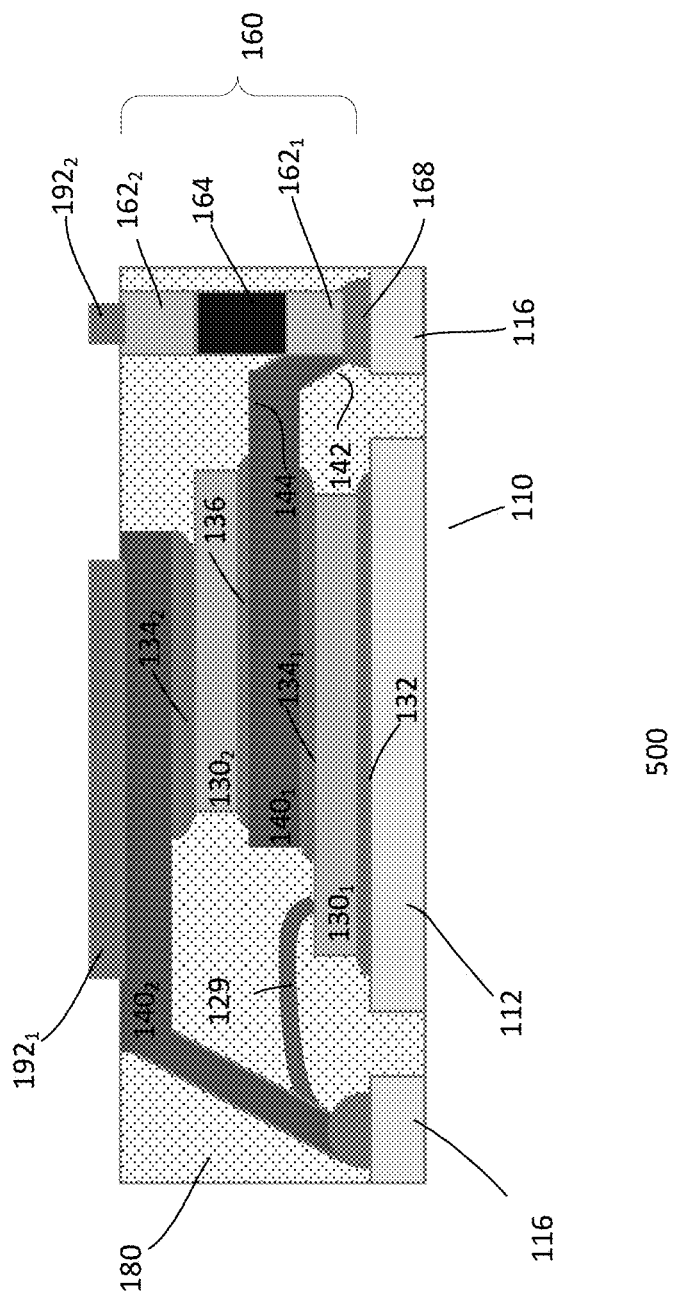

Referring to FIG. 5f, the process continues by depositing a conductive bonding layer over a top surface of the package. In one embodiment, the conductive bonding layer is patterned to form an external component-clip bonding layer $192_1$ covering the exposed top surface of the second clip bond and an external component-passive component bonding layer $192_2$ covering the exposed top surface of the second passive component terminals. Other techniques for forming the bonding layers may also be possible. For example, in the case that the bonding layers are formed of different materials, separate processes may be employed to form the bonds.

Figure 5G:
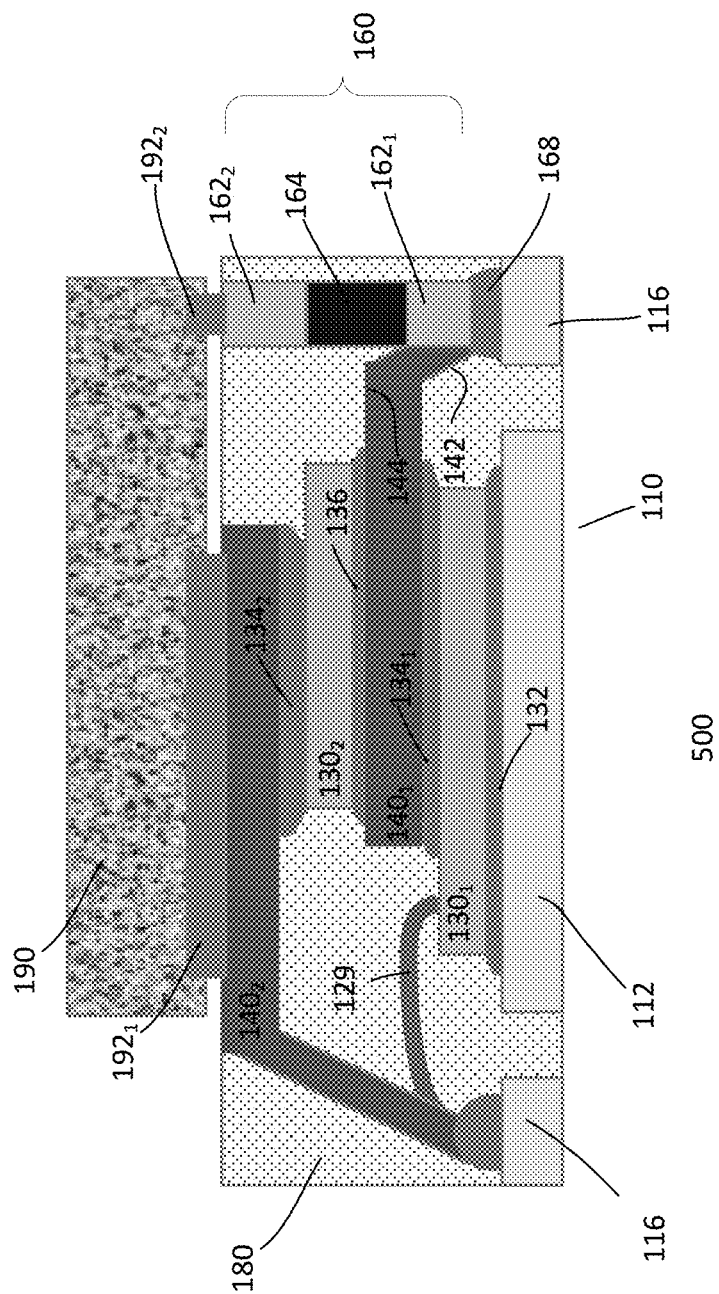

In FIG. 5g, a top component is attached to the encapsulated package. The top component is, for example, an external component 190 disposed above the encapsulated package. The external component may be, for example, another die, component or even a package. In the case of a component, the component can be another passive component, a heat spreader, or a shielding component such as an electromagnetic interference (EMI) shield. In one embodiment, the external component includes external component pads on the bottom component surface. The bottom component surface of the external component, for example, may be the active component surface with the external component pads. Providing different configurations or other numbers of the external component may also be possible.

The external component, in one embodiment, is electrically connected to the encapsulated package. For example, the external component is coupled to the second clip bond and the passive components of the encapsulated package. As shown, the external component is attached to a top surface of the upper portion of the second clip bond by the conductive external component-clip bonding layer $192_1$. The second clip bond, for example, provides a common signal to the external component and the second die. For example, the external component has an external component pad on its bottom component surface which is coupled to the second clip bond.

As for the passive components, they may be connected to the external component via their second passive component terminals. For example, the external component is coupled to the second passive component terminals of the second passive components by the conductive external component-passive component bonding layer $192_2$. It is understood that even though there may be multiple passive components, not all have to be electrically connected to the external component. For example, the external component may only be connected to one or some passive components. Additionally, in the case that there is more than one external component, one or some of the external components may be connected to the second clip bond and/or one or some passive components. Other configurations for connecting the external component or external components to the encapsulated package may also be possible.

FIGS. 6a to 6d show another embodiment of a process 600 for forming a semiconductor package. The package includes, for example, a multi-die stack which is similar to that described in FIGS. $3a_i$ to $3b_{ii}$. Common elements may not be described or described in detail.

Figure 6A:
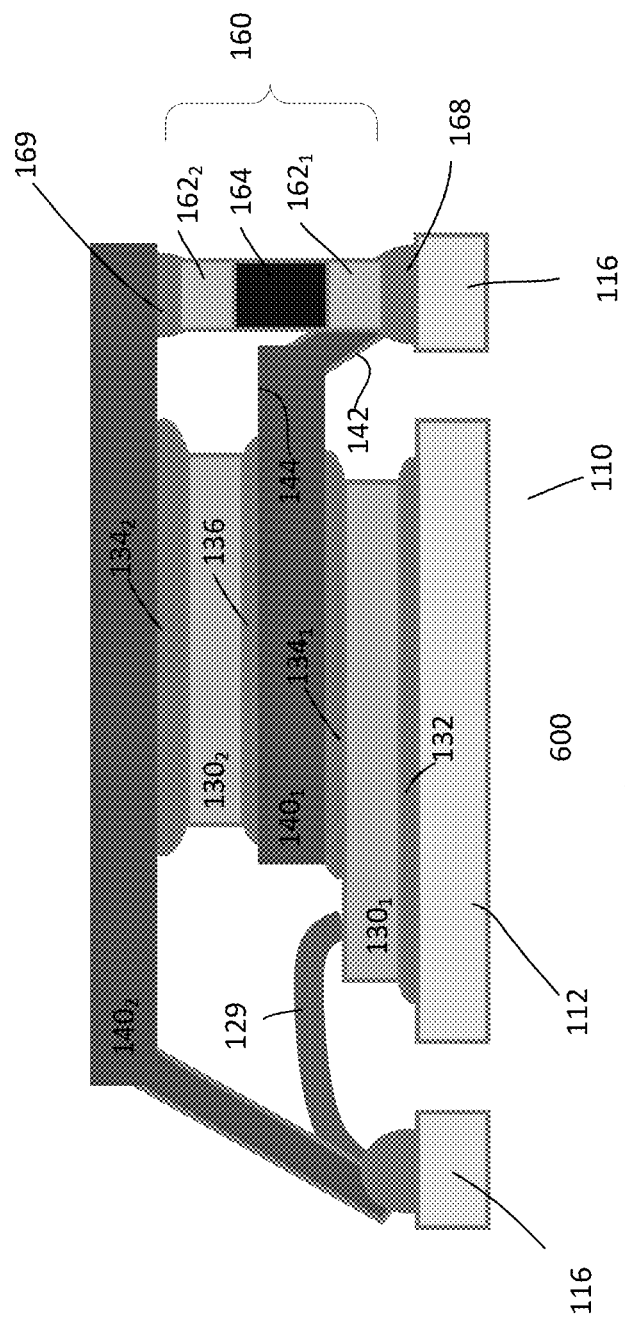

Referring to FIG. 6a, it is at the stage of processing similar to that described in FIG. 5d. For example, a second clip bond $140_2$ is provided to electrically connect the second die $130_2$ of the die stack to the package substrate. However, unlike FIG. 5d, the second clip bond is configured with a planar upper portion that extends beyond the footprint of the second die to cover the top surface of the second passive component terminals. For example, a bottom surface of the planar upper portion is bonded to one or some second passive component terminals by a conductive clip-passive component bonding layer 169. In such cases, the second passive component terminals, as shown, extend to a height just below the bottom surface of the second clip bond. It is understood that even though there may be multiple passive components, not all have to be electrically connected to the second clip bond. Furthermore, those not connected to the second clip bond may extend to a height that is planar or just above the top surface of the second clip bond. Having other configurations for the passive components may also be useful.

Figure 6B:
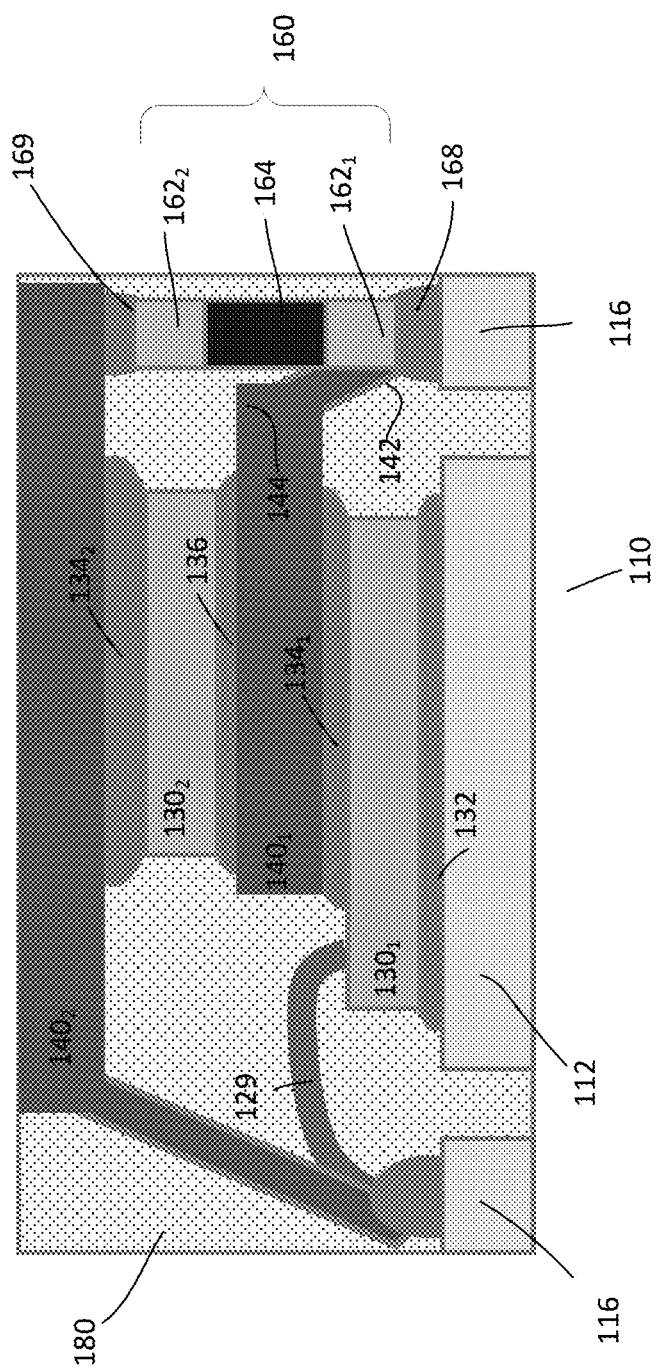

The package is encapsulated in FIG. 6b. For example, an encapsulant 180 such as a mold compound, is disposed on the package substrate. The encapsulant, for example, covers the dies, the wire bond, and the clip bonds.

In one embodiment, the encapsulant includes a top planar surface just below the top surface of the second clip bond and the top surface of the second passive component terminals not coupled to the second clip bond. For example, the top surface of the encapsulant is about 25 microns below a top surface of the second clip bond. Providing the top surface of the encapsulant by other distances may also be useful. This leaves the top surface of the second clip bond exposed to electrically couple to other connections. For example, it can be electrically connected to a top component disposed above the encapsulated package. In addition, the second passive component terminals not coupled to the second clip bond may also be exposed to electrically couple to other connections. In such cases, they can be configured to extend to a height that is planar or just above the top surface of the second clip bond.

Figure 6C:
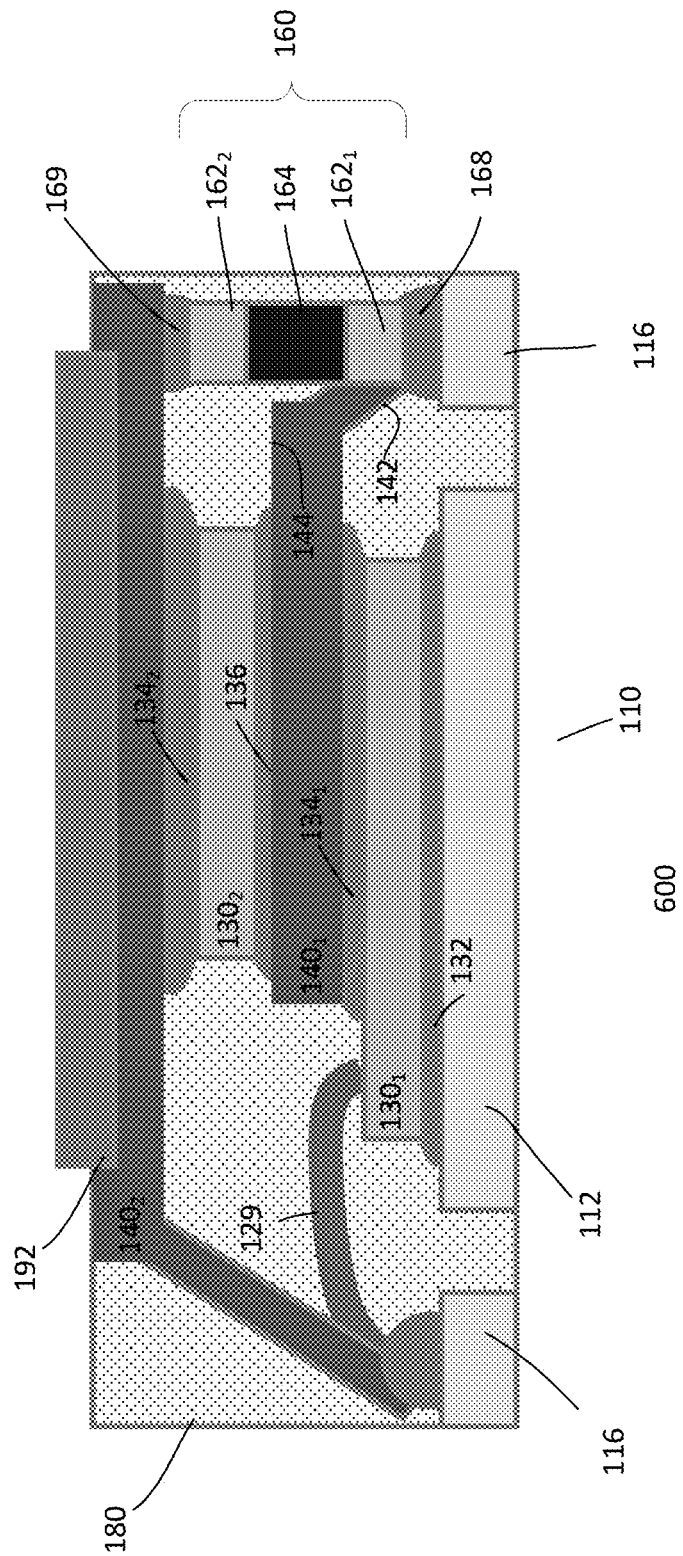

In FIG. 6c, a conductive bonding layer is disposed over the top surface of the package. In one embodiment, the conductive bonding layer is patterned to form an external component-clip bonding layer 192 covering the exposed top surface of the second clip bond. The bonding layer may be similar to the bonding layers used for bonding the clip bond to the dies, the package substrate and the passive component. Having other materials for the bonding layer may also be useful.

Figure 6D:
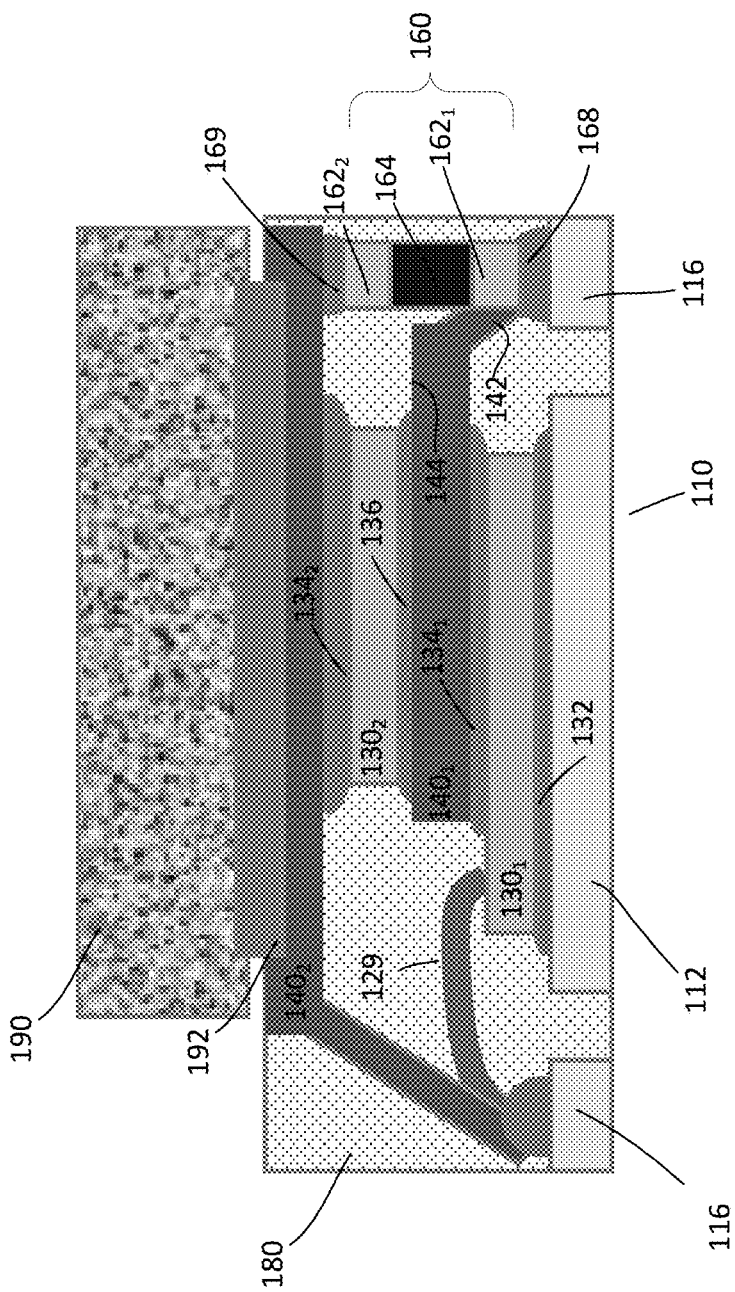

In FIG. 6d, a top component is attached to the encapsulated package. The top component is, for example, an external component 190 disposed above the encapsulated package. The external component may be, for example, another die, component or even a package. In the case of a component, the component can be another passive component, a heat spreader, or a shielding component such as an electromagnetic interference (EMI) shield. In one embodiment, the external component includes external component pads on the bottom component surface. The bottom component surface of the external component, for example, may be the active component surface with the external component pads. Providing different configurations or other numbers of the external component may also be possible.

The external component, in one embodiment, is electrically connected to the encapsulated package. For example, the external component is electrically connected to the encapsulated package via the second clip bond. As shown, the external component is attached to a top surface of the upper portion of the second clip bond. The conductive external component-clip bonding layer 192 is used to bond the external component pads of the external component to the top surface of the second clip bond. The second clip bond, for example, provides a common signal to the external component and the second die.

In the case that there is more than one external component, one or some of the external components may be connected to the second clip bond and/or one or some passive components not coupled to the second clip bond. Other configurations for connecting the external component or external components to the encapsulated package may also be possible.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
   a package substrate having top and bottom major package substrate surfaces, the top major package substrate surface includes an active package surface configured with a component attach region and terminal pads;
   a component mounted onto the component attach region of the active package surface, the component is electrically coupled to the terminal pads;
   a passive component with opposing first and second passive component terminals, wherein the passive component is attached to the package substrate in a vertical configuration comprising,
      the first passive component terminal attached to one terminal pad of the terminal pads, and
      the second passive component terminal is distal from the top major package substrate surface; and
   an encapsulant, the encapsulant forms an encapsulated package.

2. The device of claim 1 wherein a top surface of the encapsulant exposes the second passive component terminal to provide external connection for the passive component.

3. The device of claim 2 further comprises an external component disposed on the top surface of the encapsulant, wherein the second passive component terminal is coupled to the external component.

4. The device of claim 3 wherein the external component comprises a heat dissipation component.

5. The device of claim 1 wherein the one terminal pad is commonly coupled to the first passive component terminal and the component.

6. The device of claim 1 wherein electrically coupling the component to the terminal pads comprises a clip bond, wherein the clip bond electrically couples component pads of the component to the terminal pads.

7. The device of claim 1 wherein electrically coupling the component to the terminal pads comprises wire bonds, wherein the wire bonds electrically couple component pads of the component to the terminal pads.

8. The device of claim 1 wherein electrically coupling the component to the terminal pads comprises a clip bond and wire bonds, wherein the clip bond and wire bonds electrically couple component pads of the component to the terminal pads.

9. The device of claim 1 wherein:
   the component comprises a second component stacked on top of a first component which is attached to the component attach region;
   the first component is electrically coupled to first terminal pads of the terminal pads; and
   the second component is coupled to second terminal pads of the terminal pads.

10. The device of claim 9 wherein
    electrically coupling the first component to the first terminal pads comprises a first clip bond, the clip bond electrically couples first component pads of the first component to the first terminal pads; and
    electrically coupling the second component to the second terminal pads comprises a second clip bond, the clip bond electrically couples second component pads of the second component to the second terminal pads.

11. The device of claim 10 wherein a top surface of the encapsulant exposes the second passive component terminal to provide external connection for the passive component.

12. The device of claim 10 wherein the second passive component terminal is coupled to the second clip bond.

13. The device of claim 10 wherein a top surface of the encapsulant exposes the second clip bond to provide external connection.

14. A method for forming a device comprising:
providing a package substrate having top and bottom major package substrate surfaces, the top major package substrate surface includes an active package surface configured with a component attach region and terminal pads;
disposing a component on the component attach region, the component is electrically coupled to the terminal pads;
attaching a passive component with opposing first and second passive component terminals to the package substrate, wherein the first passive component terminal is attached to the package substrate in a vertical configuration comprising,
the first passive component terminal attached to one terminal pad of the terminal pads, and
the second passive component terminal is distal from the top major package substrate surface; and
depositing an encapsulant, the encapsulant forms an encapsulated package.

15. The method of claim 14 further comprises
disposing an external component on a top surface of the encapsulant, wherein the top surface of the encapsulant exposes the second passive component terminal to electrically couple to the external component.

16. The method of claim 14 wherein electrically coupling the component to the terminal pads comprises a clip bond, wherein the clip bond electrically couples component pads of the component to the terminal pads.

17. The method of claim 14 further comprises
mounting a first component to the component attach region, wherein the first component is electrically coupled to first terminal pads of the terminal pads by a first clip bond,
stacking a second component over the first component; and
disposing a second clip bond on the second component, wherein the second clip bond electrically couples the second component to second terminal pads of the terminal pads.

18. The method of claim 17 wherein a top surface of the encapsulant exposes the second passive component terminal, or the second clip bond or a combination of both the second passive component terminal and the second clip bond to provide external connection.

19. The method of claim 17 wherein the second passive component terminal is coupled to the second clip bond.

20. A device comprising:
a package substrate having top and bottom major package substrate surfaces, the top major package substrate surface includes a component mounting region and terminal pads;
a component attached to the component mounting region, wherein the component includes component pads connected to the terminal pads; and
a passive component with opposing first and second passive component terminals, wherein the passive component is attached to the package substrate in a vertical configuration comprising,
the first passive component terminal attached to one terminal pad of the terminal pads, and
the second passive component terminal is distal from the top major package substrate surface.

* * * * *